United States Patent
Maki et al.

(10) Patent No.: US 9,813,037 B2
(45) Date of Patent: *Nov. 7, 2017

(54) DETECTION DEVICE, SENSOR, ELECTRONIC APPARATUS, AND MOVING OBJECT

(71) Applicant: Seiko Epson Corporation, Tokyo (JP)

(72) Inventors: Katsuhiko Maki, Chino (JP); Masahiro Kanai, Suwa (JP)

(73) Assignee: Seiko Epson Corporation (JP)

( * ) Notice: Subject to any disclaimer, the term of this patent is extended or adjusted under 35 U.S.C. 154(b) by 220 days.

This patent is subject to a terminal disclaimer.

(21) Appl. No.: 14/534,527

(22) Filed: Nov. 6, 2014

(65) Prior Publication Data

US 2015/0122035 A1 May 7, 2015

(30) Foreign Application Priority Data

Nov. 7, 2013 (JP) ................................ 2013-231342

(51) Int. Cl.
*G01C 19/56* (2012.01)
*G01C 19/5776* (2012.01)
(Continued)

(52) U.S. Cl.
CPC ....... *H03G 3/3005* (2013.01); *G01C 19/5614* (2013.01); *G01C 19/5649* (2013.01);
(Continued)

(58) Field of Classification Search
CPC ............ G01C 19/5649; G01C 19/5776; G01C 19/5614; G01C 19/5607
(Continued)

(56) References Cited

U.S. PATENT DOCUMENTS 5,675,296 A 10/1997 Tomikawa
6,125,701 A * 10/2000 Sugitani ............. G01C 19/5607
73/504.16

(Continued)

FOREIGN PATENT DOCUMENTS

JP 05-259738 A 10/1993
JP 06-265358 A 9/1994
(Continued)

OTHER PUBLICATIONS

Sasaki et al., "Development of Three-Axis Gyroscope (Motion Sensor) for Consumer Applications", Panasonic Technical Journal, vol. 58, No. 1, p. 47-51, Apr. 2012.

*Primary Examiner* — Helen Kwok
(74) *Attorney, Agent, or Firm* — Harness, Dickey & Pierce, P.L.C.

(57) ABSTRACT

A detection device includes a driving circuit which drives a vibrator, and a detection circuit which detects a desired signal. The driving circuit includes a current-voltage conversion circuit which receives a feedback signal, and performs a current-voltage conversion, a drive signal output circuit which amplifies an input voltage signal after being subjected to the current-voltage conversion, and outputs a drive signal of a sine wave, and a gain control circuit which controls a gain of amplification of the drive signal in the drive signal output circuit. When a resistance for a current-voltage conversion is set to RI, the gain of the amplification of the drive signal in the drive signal output circuit is set to K, and an equivalent series resistance in a fundamental wave mode of the vibrator is set to R, the gain control circuit performs a gain control such that K×RI=R is satisfied.

16 Claims, 15 Drawing Sheets

(51) Int. Cl.
*G01C 19/5614* (2012.01)
*H03G 3/30* (2006.01)
*G01C 19/5649* (2012.01)
*H03F 3/45* (2006.01)

(52) U.S. Cl.
CPC ..... *G01C 19/5776* (2013.01); *H03F 3/45183* (2013.01); *H03F 2200/261* (2013.01); *H03F 2203/45212* (2013.01); *H03F 2203/45476* (2013.01); *H03F 2203/45508* (2013.01); *H03F 2203/45512* (2013.01); *H03F 2203/45528* (2013.01); *H03F 2203/45534* (2013.01); *H03F 2203/45536* (2013.01); *H03F 2203/45674* (2013.01)

(58) Field of Classification Search
USPC .................. 73/504.12, 504.16, 504.04
See application file for complete search history.

(56) References Cited

U.S. PATENT DOCUMENTS

| | | | | |
|---|---|---|---|---|
| 6,510,737 | B1 * | 1/2003 | Hobbs | G01C 19/5607 73/1.37 |
| 7,210,349 | B2 | 5/2007 | Kurihara et al. | |
| 7,808,334 | B2 | 10/2010 | Yoshida et al. | |
| 7,849,744 | B2 | 12/2010 | Kanai et al. | |
| 8,037,755 | B2 * | 10/2011 | Nagata | G01C 19/56 73/504.04 |
| 8,240,204 | B2 * | 8/2012 | Kanai | G01C 19/56 73/497 |
| 8,327,704 | B2 * | 12/2012 | Sato | G01C 19/5607 73/497 |
| 9,391,595 | B2 | 7/2016 | Higuchi et al. | |
| 2009/0013785 | A1 | 1/2009 | Yoshida et al. | |
| 2009/0133496 | A1 * | 5/2009 | Kanai | G01C 19/56 73/504.12 |
| 2009/0217757 | A1 * | 9/2009 | Nozawa | G01C 19/5607 73/504.12 |
| 2011/0061461 | A1 * | 3/2011 | Yoshida | G01C 19/56 73/504.12 |
| 2012/0111111 | A1 * | 5/2012 | Murakami | G01C 19/5614 73/504.12 |
| 2012/0191398 | A1 * | 7/2012 | Murakami | G01C 19/5776 702/99 |
| 2013/0068019 | A1 * | 3/2013 | Takase | G01C 19/56 73/504.12 |
| 2014/0007645 | A1 * | 1/2014 | Uemura | G01C 19/5614 73/1.08 |
| 2014/0305185 | A1 | 10/2014 | Maki et al. | |
| 2015/0122022 | A1 | 5/2015 | Maki et al. | |
| 2015/0122034 | A1 * | 5/2015 | Maki | H02M 3/158 73/649 |
| 2015/0122035 | A1 | 5/2015 | Maki et al. | |
| 2015/0160011 | A1 | 6/2015 | Nakajima et al. | |
| 2015/0305206 | A1 | 10/2015 | Fukuda et al. | |

FOREIGN PATENT DOCUMENTS

| | | |
|---|---|---|
| JP | 08-307199 A | 11/1996 |
| JP | 2006-029901 A | 2/2006 |
| JP | 2008-058305 A | 3/2008 |
| JP | 2008-096244 A | 4/2008 |
| JP | 2008-099257 A | 4/2008 |
| JP | 2010-169408 A | 8/2010 |

* cited by examiner

IMPEDANCE MINIMUM POINT (RESONANT POINT) = $\dfrac{\sqrt{L^2 \times (R+RN)^2 - 4 \times L \times C} - C \times (R+RN)}{2 \times L \times C}$

DETECTION DEVICE, SENSOR, ELECTRONIC APPARATUS, AND MOVING OBJECT

BACKGROUND

1. Technical Field

The present invention relates to a detection device, a sensor, an electronic apparatus, a moving object, and the like.

2. Related Art

In an electronic apparatus such as a digital camera, a smart phone, or a moving object such as a car, or an airplane, a gyroscope sensor for detecting a physical quantity which is changed due to an external factor is embedded. Such a gyroscope sensor detects a physical quantity such as angular velocity, and is used in a so-called camera shake correction, a posture control, a GPS autonomous navigation, and the like.

As one of these gyroscope sensors, a vibrational gyroscope sensor such as a crystal piezoelectric vibrational gyroscope sensor has been known. The vibrational gyroscope sensor detects a physical quantity corresponding to Coriolis force which occurs by rotation. As a detection device of the vibrational gyroscope sensor, for example, technologies disclosed in Japanese Patent No. 4930253, JP-A-2006-29901, and Panasonic Technical Journal Vol. 58 No. 1 Apr. 2012, "Development of Consumer 3-Axis Angular Velocity (Motion) Sensor", SAKAKI, FUJII, YOSHIUCHI, MORINAKA, NAKAMURA, and YAMASAKI have been known.

In the technology disclosed in Japanese Patent No. 4930253, a vibrator is driven by a drive signal of a rectangular wave of which an amplitude is controlled by an AGC circuit. However, the drive signal of a rectangular wave includes many harmonic components, and thus a detection performance of a detection device is degraded due to the harmonic component.

On the other hand, in the technology disclosed in Panasonic Technical Journal Vol. 58 No. 1 Apr. 2012, "Development of Consumer 3-Axis Angular Velocity (Motion) Sensor", SAKAKI, FUJII, YOSHIUCHI, MORINAKA, NAKAMURA, and YAMASAKI, an output signal of an AGC circuit is input into a band pass filter, and the signal after being subjected to a band pass filter processing is output to a vibrator as a drive signal. By performing such a band pass filter processing, it is possible to eliminate harmonic components other than a drive frequency component, and thus it is possible to inhibit a detection performance of a detection device from being degraded due to the harmonic component to a certain extent. However, in order to obtain a drive signal of a sine wave which has small distortion by the band pass filter processing, a band pass filter of a narrow band is necessary, and thus it is not easy to design the detection device, and it is difficult to sufficiently reduce the harmonic component of the drive signal.

In addition, in the technology disclosed in JP-A-2006-29901, two piezoelectric elements are formed on a first side surface of a vibrator, and an output signal of an oscillation circuit is input into a second side surface facing the first side surface. Then, output signals of the two piezoelectric elements are added by an adding circuit, and an added output signal is output to the oscillation circuit, and thus a drive signal of a sine wave is obtained. However, in the related art, in order to obtain the drive signal of a sine wave, a vibrator in a special structure is necessary. In addition, in any of Japanese Patent No. 4930253, JP-A-2006-29901, and Panasonic Technical Journal Vol. 58 No. 1 Apr. 2012, "Development of Consumer 3-Axis Angular Velocity (Motion) Sensor", SAKAKI, FUJII, YOSHIUCHI, MORINAKA, NAKAMURA, and YAMASAKI, a design concept of the drive signal of a sine wave in which a relationship between an equivalent series resistance and a negative resistance of the vibrator is considered is not disclosed.

SUMMARY

An advantage of some aspects of the invention is possible to provide a detection device, a sensor, an electronic apparatus, a moving object, and the like by which sine wave driving is possible by setting a negative resistance according to an equivalent series resistance of a vibrator.

The invention can be implemented as the following aspects or embodiments.

An aspect of the invention relates to a detection device including: a driving circuit which receives a feedback signal from a vibrator, and drives the vibrator; and a detection circuit which receives a detection signal from the vibrator, and detects a desired signal, wherein the driving circuit includes a current-voltage conversion circuit which receives the feedback signal, and performs a current-voltage conversion, a drive signal output circuit which amplifies an input voltage signal after being subjected to the current-voltage conversion by the current-voltage conversion circuit, and outputs a drive signal of a sine wave, and a gain control circuit which controls a gain of amplification of the drive signal in the drive signal output circuit, and when a resistance for a current-voltage conversion of the current-voltage conversion circuit is set to RI, the gain of the amplification of the drive signal in the drive signal output circuit is set to K, and an equivalent series resistance in a fundamental wave mode of the vibrator is set to R, the gain control circuit performs a gain control such that $K \times RI = R$ is satisfied.

According to the aspect of the invention, the feedback signal from the vibrator is subjected to the current-voltage conversion by the resistance for a current-voltage conversion of the current-voltage conversion circuit. Then, under the gain control of the gain control circuit, the drive signal output circuit amplifies the input voltage signal after being subjected to the current-voltage conversion, and thus the drive signal is output to the vibrator. In this case, the gain control is performed such that $K \times RI = R$ is satisfied, and thus it is possible to set the negative resistance on the driving circuit side according to the resistance of the equivalent series resistance of the vibrator. Accordingly, the vibrator is able to be driven by the drive signal of a sine wave, and it is possible to improve a detection performance of the detection device.

In the detection device according to the aspect of the invention, the drive signal output circuit may include an Operational Transconductance Amplifier (OTA) circuit in which a transconductance is set by the control voltage from the gain control circuit, and the input voltage signal is converted into a current signal, and a second current-voltage conversion circuit which performs a current-voltage conversion with respect to the current signal from the OTA circuit, and outputs the drive signal.

With this configuration, the input voltage signal is converted into the current signal by the transconductance which is set according to the control voltage, and thus it is possible to output a signal in which the current signal is subjected to the current-voltage conversion as the drive signal to the vibrator.

In the detection device according to the aspect of the invention, the OTA circuit may include a voltage-current conversion circuit which converts the control voltage from the gain control circuit into a control current, and a differential unit in which a bias current set by the control current flows to a bias current source, an analog based voltage is input into a first differential input terminal, an input voltage signal is input into a second differential input terminal, and the current signal is output to the second current-voltage conversion circuit.

With this configuration, the control voltage is converted into the control current, and thus it is possible to allow the bias current corresponding to the control current to flow into the bias current source of the differential unit. Accordingly, it is possible to convert the input voltage signal into the current signal by the transconductance which is set according to the control voltage.

In the detection device according to the aspect of the invention, the gain control circuit may include a full-wave rectifier which performs a full-wave rectification with respect to the signal after being subjected to the current-voltage conversion of the current-voltage conversion circuit, and an integrator which performs an integral processing with respect to the signal after being subjected to the full-wave rectification by the full-wave rectifier, and the voltage-current conversion circuit may convert the control voltage from the integrator into the control current.

With this configuration, by performing the full-wave rectification with respect to the signal after being subjected to the current-voltage conversion, and by performing the integral processing with respect to the signal after being subjected to the full-wave rectification, the control voltage is created, and the transconductance of the OTA circuit is set by the control voltage, and thus it is possible to convert the input voltage signal into the current signal.

In the detection device according to the aspect of the invention, when a peak-to-peak voltage of the input voltage signal of the drive signal output circuit is set to VP1, a peak-to-peak voltage of the drive signal is set to VP2, a peak-to-peak current of the drive current of the vibrator which is set by an Automatic Gain control (AGC) loop of the gain control circuit is set to IDP, and a voltage difference between a high potential side power-supply voltage and a low potential side power-supply voltage (GND) is set to VDS, VDS>VP2=K×VP1=IDP×R may be satisfied.

With this configuration, a relationship of VDS>VP2=K× VP1=IDP×R is satisfied, and thus the negative resistance on the driving circuit side is set to the resistance according to the equivalent series resistance of the vibrator, and the vibrator is able to be driven by the drive signal of a sine wave.

In the detection device according to the aspect of the invention, the drive signal output circuit may include a rectangular wave signal output circuit which receives the input voltage signal, and outputs a rectangular wave signal, and the drive signal output circuit may output the rectangular wave signal from the rectangular wave signal output circuit to the vibrator as the drive signal in an oscillation start-up period of the vibrator, and output the drive signal of a sine wave after the oscillation start-up period is completed.

With this configuration, in the oscillation start-up period, it is possible to output the rectangular wave signal from the rectangular wave signal output circuit to the vibrator as the drive signal, and thus it is possible to shorten the oscillation start-up period. Then, after the oscillation start-up period is completed, the vibrator is driven by the drive signal of a sine wave, and thus it is possible to improve the detection performance.

Another aspect of the invention relates to a sensor including any of the detection devices described above; and a vibrator.

Still another aspect of the invention relates to an electronic apparatus including any of the detection devices described above.

Yet another aspect of the invention relates to a moving object including any of the detection devices described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferable embodiment of the invention will be described in detail. Furthermore, this embodiment described hereinafter does not unrightfully limit the contents disclosed in the appended claims, and entire configurations described in this embodiment are not essential as a solution of the invention. For example, hereinafter, a case where a vibrator is a piezoelectric vibrator (a vibrational gyroscope), and a sensor is a gyroscope sensor is described as an example, but the invention is not limited thereto. For example, the invention is able to be applied to an electrostatic capacitance detection type vibrator (a vibrational gyroscope) formed of a silicon substrate or the like, a sensor which detects a physical quantity equivalent to angular velocity information, and a physical quantity other than angular velocity information, and the like.

1. Electronic Apparatus and Gyroscope Sensor

Figure 1:
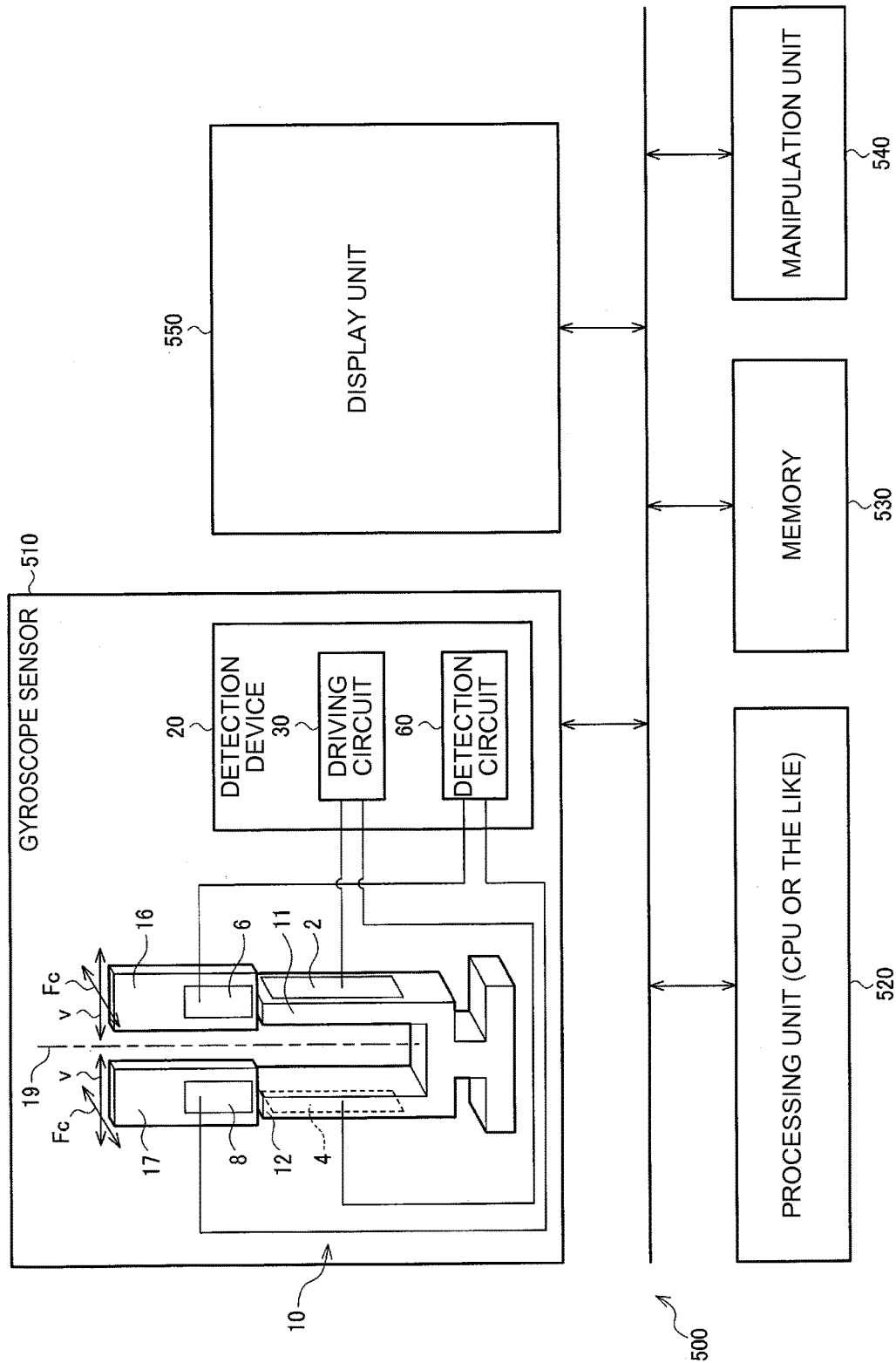
FIG. 1 is a configuration example of an electronic apparatus and a gyroscope sensor according to this embodiment.

FIG. 1 illustrates a configuration example of a gyroscope sensor 510 (in a broad sense, a sensor) including a detection device 20 according to this embodiment, and an electronic apparatus 500 including the gyroscope sensor 510. Furthermore, the electronic apparatus 500 and the gyroscope sensor 510 are not limited to the configuration illustrated in FIG. 1, and are able to be variously changed by omitting a part of constituents thereof or by adding other constituents. In addition, as the electronic apparatus 500 of this embodiment, various equipment such as a digital camera, a camcorder, a smart phone, a mobile phone, a car navigation system, a robot, a game console, a chronometer, health appliances, or a portable information terminal are able to be assumed.

The electronic apparatus 500 includes the gyroscope sensor 510 and a processing unit 520. In addition, the electronic apparatus 500 may include a memory 530, a manipulation unit 540, and a display unit 550. The processing unit 520 (a CPU, an MPU, and the like) controls the gyroscope sensor 510 or the like, or controls the entire electronic apparatus 500. In addition, the processing unit 520 performs a process on the basis of angular velocity information (in a broad sense, a physical quantity) detected by the gyroscope sensor 510. For example, a process of a camera shake correction, a posture control, a GPS autonomous navigation, and the like is performed on the basis of the angular velocity information. The memory 530 (a ROM, a RAM, and the like) stores a control program or various data items, or functions as a work region or a data storage region. The manipulation unit 540 allows a user to manipulate the electronic apparatus 500, and the display unit 550 displays various information items to the user.

The gyroscope sensor 510 (a sensor) includes a vibrator 10, and a detection device 20. The vibrator 10 (in a broad sense, a physical quantity transducer) of FIG. 1 is a tuning fork type piezoelectric vibrator which is formed of a thin plate of a piezoelectric material such as a crystal, and includes vibrators 11 and 12 for driving, and vibrators 16 and 17 for detection. The vibrators 11 and 12 for driving are provided with drive terminals 2 and 4, and the vibrators 16 and 17 for detection are provided with detection terminals 6 and 8.

A driving circuit 30 included in the detection device 20 outputs a drive signal (a drive voltage) and drives the vibrator 10. Then, the driving circuit 30 receives a feedback signal from the vibrator 10, and thus excites the vibrator 10. A detection circuit 60 receives a detection signal (a detection current, and an electric charge) from the vibrator 10 which is driven by the drive signal, and detects (extracts) a desired signal (a Coriolis force signal) corresponding to a physical quantity applied to the vibrator 10 from the detection signal.

Specifically, the drive signal (the drive voltage) of an alternate current from the driving circuit 30 is applied to a drive terminal 2 of the vibrator 11 for driving. Then, the vibrator 11 for driving starts vibration by a reverse voltage effect, and the vibrator 12 for driving starts vibration by tuning fork type vibration. At this time, a current (an electric charge) generated by a piezoelectric effect of the vibrator 12 for driving is fed back to the driving circuit 30 from a drive terminal 4 as a feedback signal. Accordingly, an oscillation loop including the vibrator 10 is formed.

When the vibrators 11 and 12 for driving are vibrated, the vibrators 16 and 17 for detection are vibrated at a vibration velocity v in a direction illustrated in FIG. 1. Then, a current (an electric charge) generated by a piezoelectric effect of the vibrators 16 and 17 for detection is output from the detection terminals 6 and 8 as a detection signal (a first detection signal and a second detection signal). Then, the detection circuit 60 receives the detection signal from the vibrator 10, and detects a desired signal (a desired wave) which is a signal corresponding to the Coriolis force. That is, when the vibrator 10 (a gyroscope sensor) is rotated around a detection axis 19 as a center, Coriolis force Fc is generated in a direction perpendicular to a vibration direction of the vibration velocity v. For example, an angular velocity at the time of being rotated around the detection axis 19 as a center is set to $\omega$, a mass of the vibrator is set to m, and a vibration velocity of the vibrator is set to v, and the Coriolis force is shown by $Fc=2m \cdot v \cdot \omega$. Accordingly, the detection circuit 60 detects the desired signal which is the signal corresponding to the Coriolis force, and thus it is possible to obtain the rotation angular velocity $\omega$ of the gyroscope sensor. Then, by using the obtained angular velocity $\omega$, the processing unit 520 is able to perform various processes of a camera shake correction, a posture control, a GPS autonomous navigation, and the like.

Furthermore, in FIG. 1, a case where the vibrator 10 is a tuning fork type vibrator is illustrated as an example, but the vibrator 10 of this embodiment is not limited to such a configuration. For example, the vibrator may be a T-shaped vibrator, a double T-shaped vibrator, and the like. In addition, the piezoelectric material of the vibrator 10 may be other materials in addition to the crystal.

2. Detection Device

Figure 2:
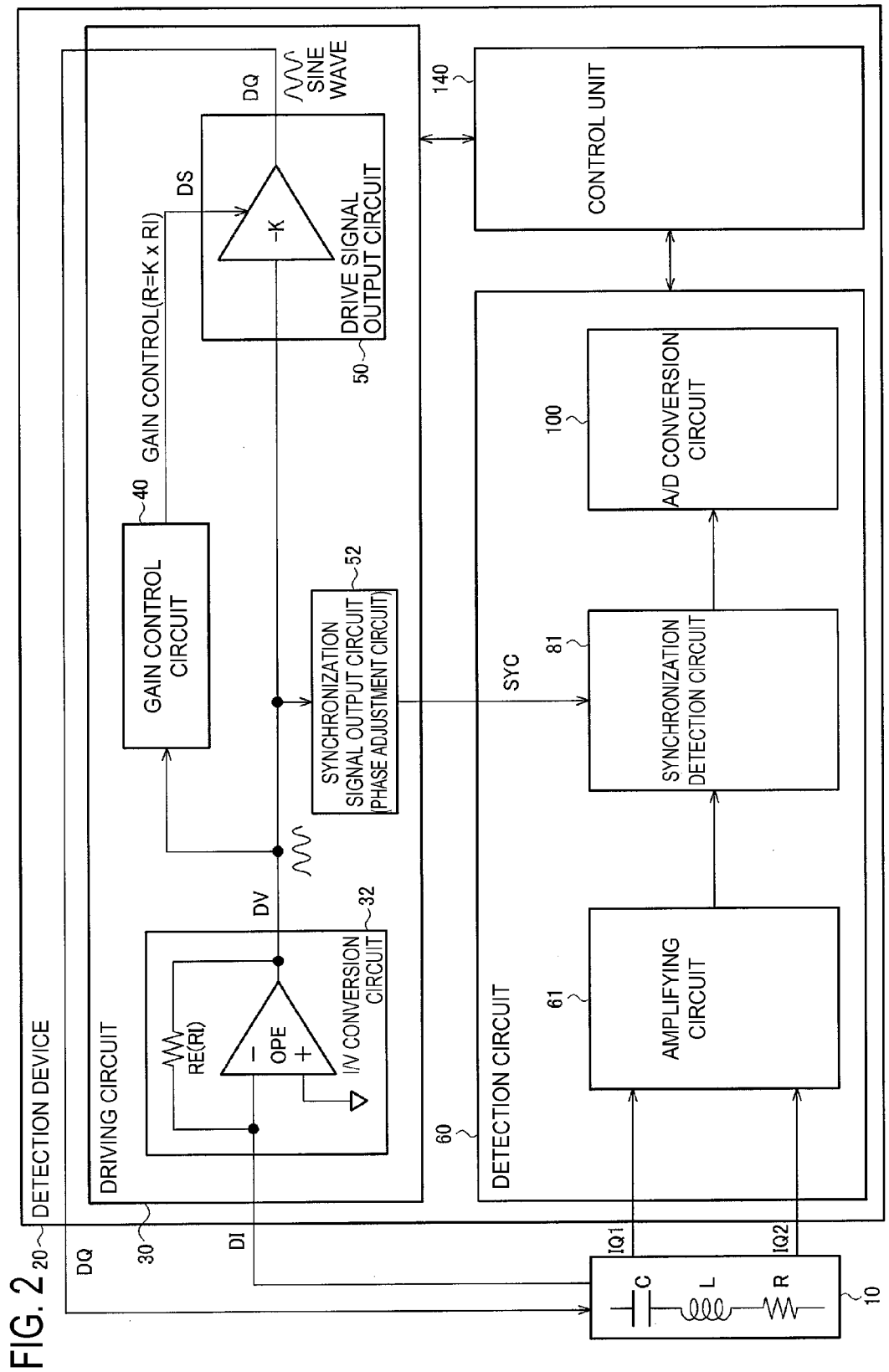
FIG. 2 is a configuration example of a detection device according to this embodiment.

FIG. 2 illustrates a configuration example of the detection device 20 according to this embodiment. The detection device 20 includes the driving circuit 30 which receive a feedback signal DI from the vibrator 10 (the physical quantity transducer), and drives the vibrator 10, and the detection circuit 60 which receives detection signals IQ1 and IQ2 from the vibrator 10, and detects the desired signal.

The driving circuit 30 includes an amplifying circuit 32 into which the feedback signal DI from the vibrator 10 is input, a gain control circuit 40 which performs an automatic gain control, and a drive signal output circuit 50 which outputs a drive signal DQ to the vibrator 10. In addition, the driving circuit 30 includes a synchronization signal output circuit 52 which outputs a synchronization signal SYC to the detection circuit 60. Furthermore, a configuration of the driving circuit 30 is not limited to the configuration illustrated in FIG. 2, and is able to be variously changed by omitting a part of constituents thereof or by adding other constituents.

The I/V conversion circuit 32 (a current-voltage conversion circuit) receives the feedback signal DI from the vibrator 10, and performs an I/V conversion (a current-voltage conversion). For example, the I/V conversion circuit 32 converts the signal DI of a current from the vibrator 10 into a signal DV of a voltage, and outputs the signal. The I/V conversion circuit 32 (an amplification circuit) is able to be realized by a capacitor, a resistive element, an operational amplifier, and the like.

The drive signal output circuit 50 (a gain amplifier) outputs the drive signal DQ on the basis of the signal DV after being subjected to the I/V conversion (amplification) by the I/V conversion circuit 32. For example, the drive signal output circuit 50 amplifies the signal DV after being subjected to the I/V conversion, and outputs the drive signal DQ of a sine wave. Furthermore, other circuit elements may be disposed between the I/V conversion circuit 32 and the drive signal output circuit 50, and the signal DV after being subjected to the I/V conversion (the amplification) may be an output signal of the circuit element.

The gain control circuit 40 controls a gain of amplification of the drive signal DQ in the drive signal output circuit 50 (a gain amplifier). For example, the gain control circuit 40 outputs the control voltage DS to the drive signal output circuit 50, and controls an amplitude of the drive signal DQ. Specifically, the gain control circuit 40 monitors the signal DV, and controls a gain of an oscillation loop. For example, in order to constantly maintain sensitivity of the gyroscope sensor, it is necessary that the driving circuit 30 constantly maintain an amplitude of the drive voltage to be supplied to the vibrator 10 (the vibrator for driving). For this reason, in the oscillation loop of a drive vibration-system, the gain control circuit 40 for automatically adjusting a gain is disposed. The gain control circuit 40 variably and automatically adjusts the gain such that an amplitude (the vibration velocity v of the vibrator) of the feedback signal DI from the vibrator 10 is constant.

The synchronization signal output circuit 52 receives the signal DV after being subjected to the I/V conversion by the I/V conversion circuit 32, and outputs the synchronization signal SYC (a reference signal) to the detection circuit 60. The synchronization signal output circuit 52 is able to be realized by a comparator which creates a synchronization signal SYC of a rectangular wave by performing a binarization process with respect to a signal DV of a sine wave (an alternate current), a phase adjustment circuit (a phase shifter) which performs a phase adjustment with respect to the synchronization signal SYC, and the like.

The detection circuit 60 includes an amplifying circuit 61, a synchronization detection circuit 81, and an A/D conversion circuit 100. The amplifying circuit 61 receives a first detection signal IQ1 and a second detection signal IQ2 from the vibrator 10, and performs signal amplification or an electric charge-voltage conversion. The synchronization detection circuit 81 performs a synchronous detection on the basis of the synchronization signal SYC of the driving circuit 30. The A/D conversion circuit 100 performs an A/D conversion with respect to the signal after being subjected to the synchronous detection. Furthermore, as a configuration of the detection circuit 60, various types of configurations described later are able to be adopted. The details will be described later.

The detection device 20 may further include the control unit 140. The control unit 140 performs a control process with respect to detection device 20. The control unit 140 is able to be realized by a logic circuit (a gate array or the like), a processor, and the like. Various switching controls, mode settings, and the like with respect to the detection device 20 are performed by the control unit 140.

3. Drive Signal of Sine Wave

In this embodiment, the drive signal output circuit 50 outputs the drive signal DQ of a sine wave, and drives the vibrator 10. Specifically, as described above, the gain control circuit 40 controls the gain of the amplification of the drive signal DQ in the drive signal output circuit 50. Then, the I/V conversion circuit 32 includes a resistive element RE for an I/V conversion. For example, the I/V conversion circuit 32 includes an operational amplifier OPE, and a feedback resistive element RE disposed between an output node of the operational amplifier OPE and a node of an inversion input terminal.

Here, a resistance for an I/V conversion (for a current-voltage conversion) which is a resistance value of the resistive element RE is set to RI. In addition, the gain of the amplification of the drive signal DQ in the drive signal output circuit 50 is set to K. In addition, an equivalent series resistance (an equivalent series resistance value) of the vibrator 10 in a fundamental wave mode is set to R. For example, the vibrator 10 is shown by equivalent circuits of C, L, and R as illustrated in FIG. 2, and the equivalent series resistance (a resonant resistance) thereof is set to R.

In this case, the gain control circuit 40 performs a gain control to satisfy K×RI=R. For example, the gain control is performed by an AGC loop such that the gain shown by a relational expression of K×RI=R is a target gain. Then, the drive signal output circuit 50 amplifies the voltage signal DV after being subjected to the I/V conversion by the I/V conversion circuit 32 with the gain in which the relational expression of K×RI=R is satisfied, and outputs the drive signal DQ. Thus, as the drive signal DQ, it is possible to drive the vibrator 10 by outputting not the rectangular wave signal but a sine wave signal to the vibrator 10.

However, in order to oscillate the vibrator, it is necessary that a negative resistance which is sufficient for cancelling a resistance component (and a parasitic resistance such as a contact resistance, or a wiring resistance due to a connection between the vibrator and the circuit) included in the vibrator be realized by an active circuit. That is, a design concept for setting a circuit configuration realizing the negative resistance or a value of the negative resistance is important.

Figure 3A:
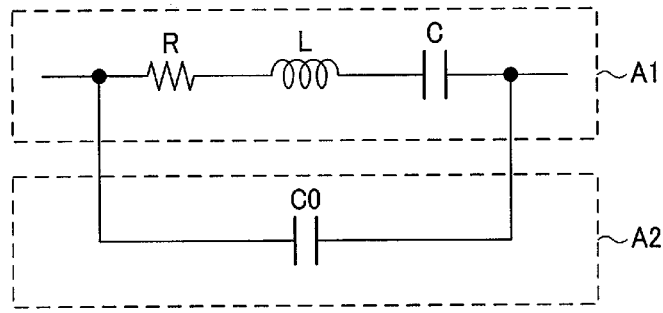
FIGS. 3A to 3C are explanatory views of a negative resistance of a driving circuit of a vibrator.

For example, an electrical equivalent circuit of the vibrator (a crystal vibrator) is shown as illustrated in FIG. 3A. An equivalent series resistance R, an equivalent series inductance L, and an equivalent series capacitance C illustrated by A1 are a portion corresponding to a mechanical resonant circuit. An electrical element of a capacitance C0 illustrated by A2 is an element on an active circuit side, and considers the negative resistance.

Figure 3B:
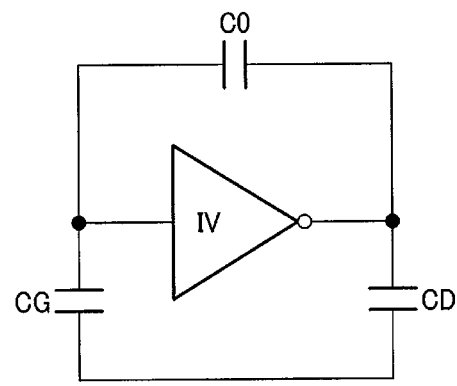

For example, as in FIG. 3B, in a circuit of a usual oscillator using an inverter circuit IV, it is not necessary for a large current to flow, and it is sufficient that the vibrator be oscillated. In the circuit, a negative resistance RN is able to be shown as the following Expression (1).

$$RN=-(CG \times CD)/(Gm \times C0) \qquad (1)$$

Here, CG and CD are parasitic capacitances of a gate and a drain of the inverter circuit IV, and Gm is a trans conductance.

Figure 3C:
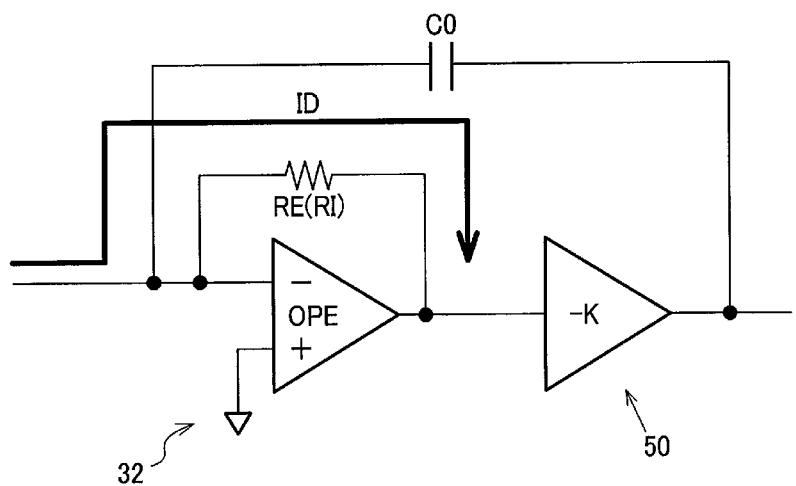

On the other hand, as illustrated in FIG. 3C, in the circuit of the gyroscope sensor, in order to increase detection sensitivity, it is necessary that the vibrator be largely vibrated, and thus it is necessary for a large drive current ID to flow. In the circuit, the negative resistance RN is able to be shown as the following Expression (2).

$$RN=-K \times RI \qquad (2)$$

Here, K is the gain of the signal amplification in the drive signal output circuit 50, and RI is the resistance for an I/V conversion (for example, the resistance value of the resistive element RE).

Figure 4A:
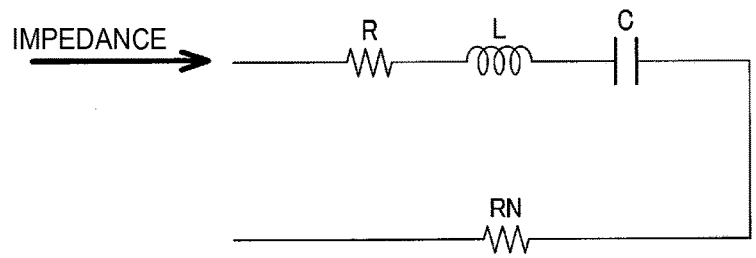
FIGS. 4A and 4B are explanatory views of a method for allowing the vibrator to oscillate by sine wave driving.

Next, to what value the negative resistance RN is set is considered. In an equivalent circuit of FIG. 4A, a resonant point which is an impedance minimum point is able to be shown by an expression illustrated by C1 in FIG. 4A. Here, C, L, and R are an equivalent series capacitance, an equivalent series inductance, and an equivalent series resistance of the vibrator.

Figure 4B:
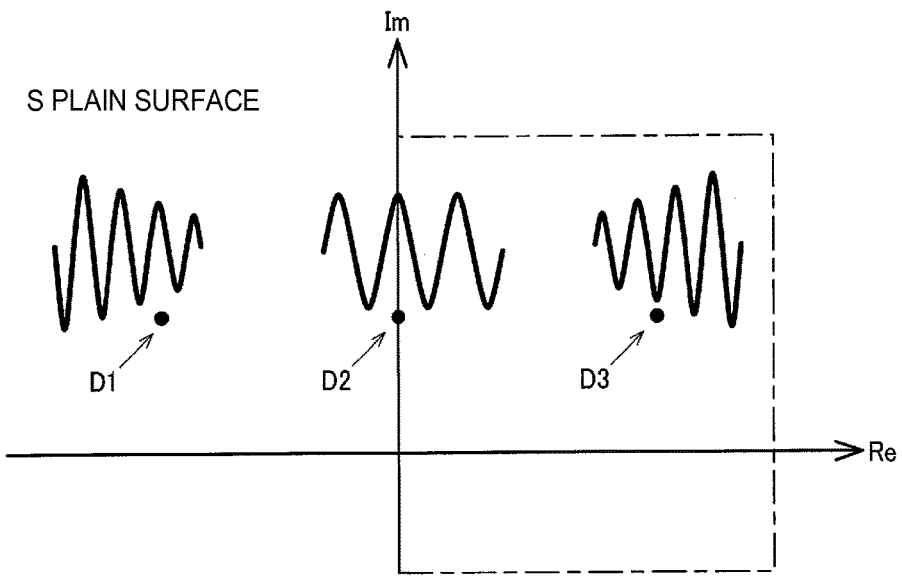

For this reason, when R+RN>0, as illustrated by D1 in FIG. 4B, the resonant point is positioned on a left half surface of an S plain surface. In this case, the amplitude of oscillation decreases over time. Accordingly, the oscillation is stopped in due course of time.

In contrast, when R+RN=0, as illustrated by D2 in FIG. 4B, the resonant point is positioned on an imaginary axis of the S plain surface, and a frequency is shown by $\omega s = 1/(L \times C)^{1/2}$, and thus the oscillation has a constant amplitude. Then, in this case, the oscillation is continued.

In addition, when R+RN<0, as illustrated by D3 in FIG. 4B, the resonant point is positioned on a right half surface of the S plain surface, and the amplitude of the oscillation increases over time. In this case, the oscillation is also continued.

Figure 5A:
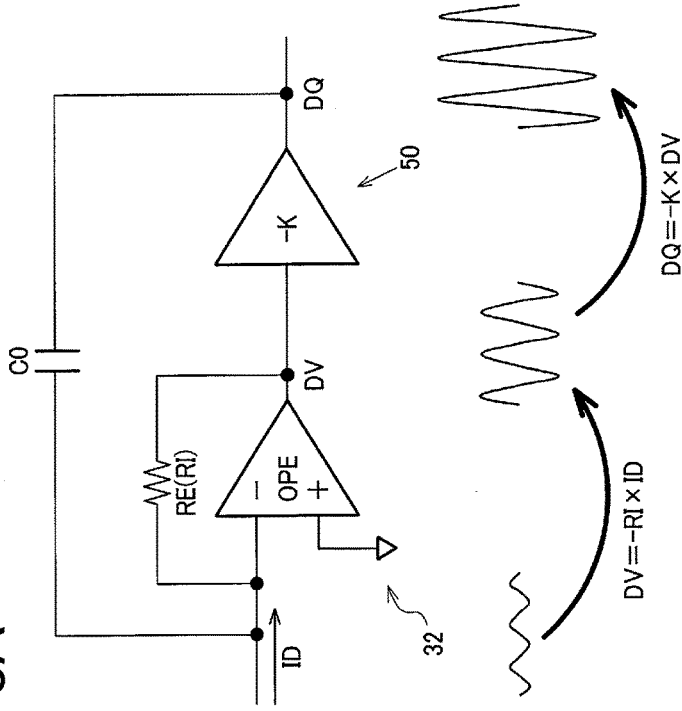
FIGS. 5A to 5D are also explanatory views of the method for allowing the vibrator to oscillate by the sine wave driving.

Then, in FIG. 5A, when an input current (the drive current) is set to ID, an output signal DV of the I/V conversion circuit 32 is shown by DV=−RI×ID. Then, the signal DV is amplified by the drive signal output circuit 50 which amplifies the signal with the gain K, and thus the drive signal is DQ=−K×DV=K×RI×ID.

Figure 5B:
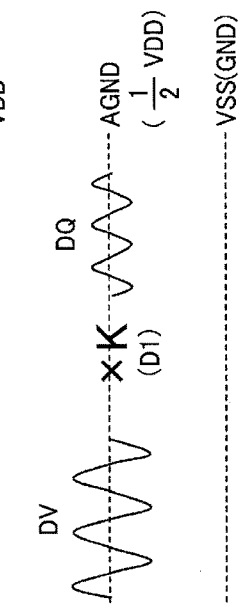

Here, as illustrated by D1 in FIG. 4B, when R+RN>0, as illustrated in FIG. 5B, the amplitude of the drive signal DQ is less than that of the signal DV, and the oscillation is stopped.

Figure 5C:
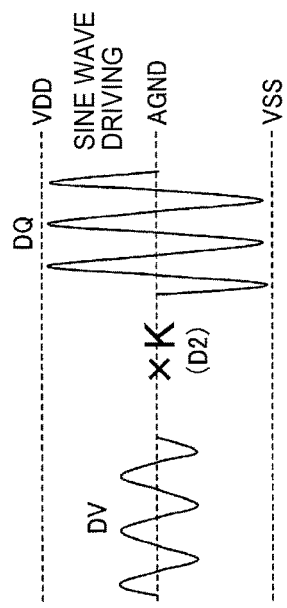

In addition, as illustrated by D2 in FIG. 4B, when R+RN=0, as illustrated in FIG. 5C, the amplitude of the drive signal DQ is greater than that of the signal DV and is turned into the sine wave signal, and thus the oscillation is continued.

Figure 5D:
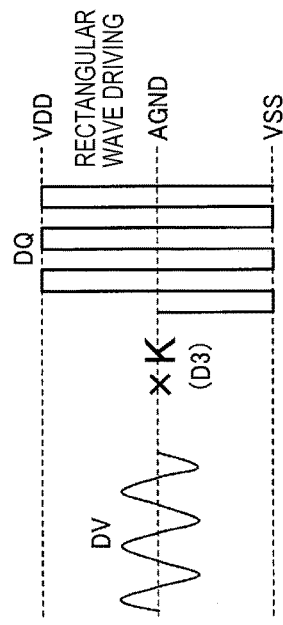

In contrast, as illustrated by D3 in FIG. 4B, when R+RN<0, as illustrated in FIG. 5D, the amplitude of the drive signal DQ exceeds a voltage range of the high potential side power-supply voltage VDD to the low potential side power-supply voltage VSS (GND) and is turned into the rectangular wave signal. In this case, the oscillation itself is also continued.

However, as illustrated in FIG. 5D, when the drive signal DQ is turned into the rectangular wave signal, as described later, the rectangular wave signal includes a lot of harmonic components, and thus the detection performance of the detection device is degraded due to the harmonic component.

On the other hand, as illustrated in FIG. 5B, when R+RN>0, the amplitude of the drive signal DQ decreases, and thus the oscillation is not continued but is stopped.

Therefore, in this embodiment, as illustrated in FIG. 2, when the resistance for an I/V conversion is set to RI, a gain of the drive signal output circuit 50 is set to K, and the equivalent series resistance (including the parasitic resistance) of the vibrator 10 is set to R, the gain control circuit 40 performs the gain control such that the relational expression of K×RI=R is satisfied. That is, the gain control for satisfying the relationship of K×RI=R is performed. Furthermore, satisfying K×RI=R is a target, but it is not necessary that K×RI=R be strictly satisfied.

Here, as shown by Expression (2) described above, in the driving circuit 30 of this embodiment, the negative resistance satisfies the relational expression of RN=−K×RI. Accordingly, the gain control is performed such that K×RI=R is satisfied, and thus R+RN=K×RI+(−K×RI)=0 is satisfied. Accordingly, the vibrator 10 is able to be driven by the sine wave as illustrated in FIG. 5C.

That is, when the gain control which is set to K×RI=R is performed, the relationship of R+RN=0 is satisfied, and thus as illustrated by D2 in FIG. 4B, the resonant point is positioned on the imaginary axis of the S plain surface.

Then, for example, when the resonant point is moved to the left half surface side of the S plain surface as illustrated by D1 in FIG. 4B, and the amplitude of the drive signal DQ decreases as illustrated in FIG. 5B, the AGC loop of the gain control circuit 40 is moved, and thus the gain control by which the resonant point is returned to the imaginary axis is performed. Accordingly, it is possible to inhibit the oscillation from being stopped by a decrease in the amplitude of the drive signal DQ.

In contrast, when the resonant point is moved to the right half surface side of the S plain surface as illustrated by D3 in FIG. 4B, and the drive signal DQ is turned into a rectangular signal as illustrated in FIG. 5D, the AGC loop of the gain control circuit 40 is moved, and thus the gain control by which the resonant point is returned to the imaginary axis is performed. Accordingly, it is possible to inhibit the detection performance from being degraded by turning the drive signal DQ into the rectangular signal.

For example, in the related art, only in order to make the drive current of the vibrator 10 constant, the gain control by the AGC loop is performed. In this case, when a gain K decreases, as illustrated in FIG. 5B, the amplitude of the drive signal DQ decreases, and the oscillation is stopped, and thus a circuit design is performed by a design method in which the gain K increases as much as possible.

However, in the design method, by setting the gain K to a large value, an absolute value of the negative resistance RN (=−K×RI) also increases, and thus the relationship of R+RN<0 is satisfied. Accordingly, as a result, the vibrator is driven by the rectangular wave driving as illustrated in FIG. 5D, and thus the detection performance is degraded due to occurrence of the harmonic component.

In this respect, the inventors of the invention focus on a relationship between a resistance RI for an I/V conversion and the gain K of the drive signal output circuit 50 in FIG. 5A. Then, the gain control by the AGC loop satisfying K×RI=R is performed, and thus it is found that the vibrator 10 is able to be driven by the drive signal DQ of a sine wave as illustrated in FIG. 5C.

That is, the gain control circuit 40 including the AGC loop is used as a circuit which not only makes the drive current of the vibrator 10 constant but also satisfies K×RI=R. Thus, as illustrated by D2 in FIG. 4B, the gain control by the AGC loop is performed such that the resonant point is positioned on the imaginary axis of the S plain surface, and thus the oscillation is inhibited from being stopped, or the drive signal DQ is inhibited from being turned into the rectangular wave signal. As a result, the vibrator 10 is able to be driven by the drive signal DQ of a sine wave, and thus the detection performance of the detection device is successfully improved.

4. Detailed Configuration Example of Driving Circuit

Figure 6:
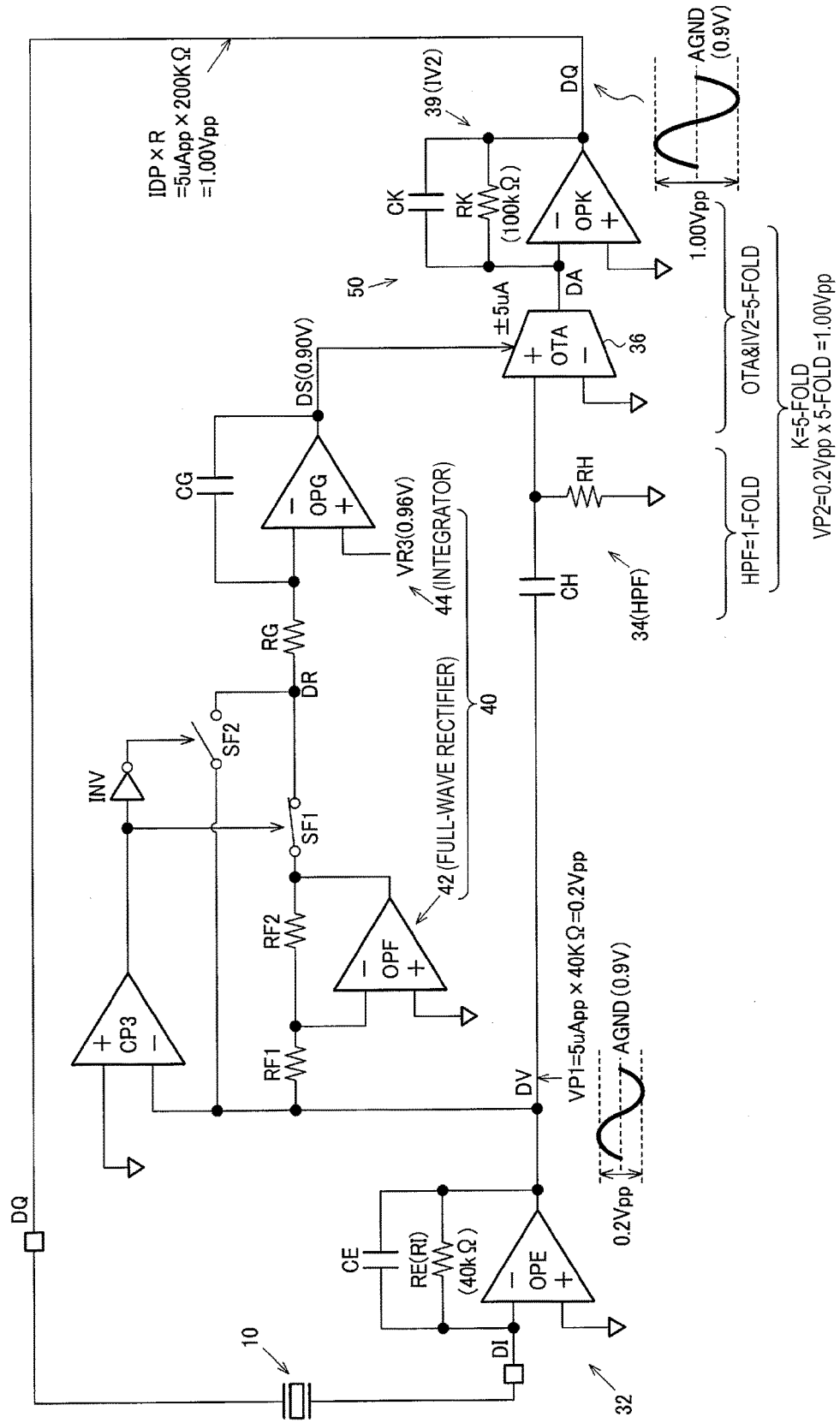
FIG. 6 is a detailed configuration example of the driving circuit which realizes a method according to this embodiment.

FIG. 6 illustrates a detailed configuration example of the driving circuit 30 which realizes a method of this embodiment.

In FIG. 6, the I/V conversion circuit 32 is an integral type current-voltage conversion circuit having lowpass filter properties, and includes the operational amplifier OPE, a capacitor CE, and the resistive element RE. Here, the resistance value of the resistive element RE is a resistance RI for a current-voltage conversion. A non-inversion input terminal (a first input terminal) of the operational amplifier OPE is set to a predetermined potential (for example, AGND), and the signal DI from the vibrator 10 is input to an inversion input terminal (a second input terminal). The capacitor CE and the resistive element RE are disposed between an output node of the I/V conversion circuit 32 and a node of the inversion input terminal of the operational amplifier OPE.

The gain control circuit 40 (AGC) is a circuit which automatically adjusts the gain such that the loop gain is 1 in a normal state of the oscillation, and includes a full-wave rectifier 42, and an integrator 44. Furthermore, the gain control circuit 40 may include an oscillation detector detecting an oscillation state, and the like.

The full-wave rectifier 42 performs a full-wave rectification with respect to the signal DV after being subjected to the I/V conversion of the I/V conversion circuit 32, and outputs a signal DR after being subjected to the full-wave rectification to the integrator 44. The full-wave rectifier 42 includes an operational amplifier OPF, resistive elements RF1 and RF2, a comparator CP3, switch elements SF1 and SF2, and an inverter circuit INV.

The resistive element RF1 is disposed between an input node of the signal DV and a node of an inversion input terminal of the operational amplifier OPF, and the resistive element RF2 is disposed between an output node of the operational amplifier OPF and the node of the inversion input terminal.

The switch element SF1 is disposed between the output node of the operational amplifier OPF and an input node of the integrator 44, and the switch element SF2 is disposed between a node of the signal DV and the input node of the integrator 44. Then, the switch elements SF1 and SF2 are exclusively ON and OFF controlled on the basis of an output signal of the comparator CP3 comparing the voltage of the signal DV with a voltage of a predetermined potential. Accordingly, the signal DR is a signal in which the signal DV is subjected to the full-wave rectification.

The integrator 44 outputs the control voltage DS of the amplitude of the drive signal DQ to the drive signal output circuit 50. Specifically, the integrator 44 performs an integral process with respect to the signal DR which is subjected to the full-wave rectification by the full-wave rectifier 42, and outputs the control voltage DS obtained by the integral process to the drive signal output circuit 50.

The integrator 44 includes an operational amplifier OPG, a resistive element RG, and a capacitor CG. The capacitor CG is disposed between an output node of the operational amplifier OPG and a node of an inversion input terminal of the operational amplifier OPG. A non-inversion input terminal of the operational amplifier OPG is set to a predetermined voltage VR3. The resistive element RG is disposed between an input node of the integrator 44 and the node of the inversion input terminal of the operational amplifier OPG.

Then, in this embodiment, the drive signal output circuit 50 includes an Operational Transconductance Amplifier (OTA) circuit 36, and an I/V conversion circuit 39 (a second current-voltage conversion circuit). Furthermore, a highpass filter 34 is disposed on an input stage side of the drive signal output circuit 50. The highpass filter 34 includes a resistive element RH, and a capacitor CH. Furthermore, the drive signal output circuit 50 is able to be variously changed by omitting a configuration of the highpass filter 34, by disposing a lowpass filter or the like instead of the highpass filter 34, and the like.

The OTA circuit 36 receives the control voltage DS from the gain control circuit 40, and an input voltage signal DV after being subjected to the I/V conversion by the I/V conversion circuit 32 (a signal after being subjected to a highpass filter processing). Then, for example, a transconductance (Gm) is set in the OTA circuit 36 by the control voltage DS, and the OTA circuit 36 converts the input voltage signal DV into a current signal DA. The I/V conversion circuit 39 performs the I/V conversion (the current-voltage conversion) with respect to the current signal DA from the OTA circuit 36, and outputs the drive signal DQ.

Furthermore, the buffer circuit may buffer an output signal of the I/V conversion circuit 39, may amplify the amplitude of the drive signal DQ, and may output the signal to the vibrator 10. When such a buffer circuit is disposed, a gain K in a relational expression of K×RI=R is a combination of a gain of the signal amplification of the drive signal output circuit 50 and a gain of amplitude amplification of the buffer circuit.

The OTA circuit 36, for example, is a circuit which outputs a current proportional (approximately proportional) to an input voltage, and when a transconductance of the OTA circuit 36 is set to Gm, the OTA circuit 36 converts the input voltage signal DV into the current signal DA using Gm as a proportional constant. Then, the transconductance Gm of the OTA circuit 36 is set by the control voltage DS from the integrator 44, and thus the OTA circuit 36 converts the input voltage signal DV into the current signal DA using the transconductance Gm according to the control voltage DS. Then, the I/V conversion circuit 39 (IV2) converts the current signal DA from the OTA circuit 36 into the voltage signal, and outputs the voltage signal as the drive signal DQ. Accordingly, as a result, the drive signal output circuit 50 amplifies the input voltage signal DV with the gain according to the control voltage DS, and outputs the drive signal DQ.

However, in FIG. 6, a resistance for an I/V conversion is set to RI=40 KΩ. In FIG. 6, the resistance RI is a resistance value of a feedback resistive element RE of the I/V conversion circuit 32. In addition, a gain of the highpass filter 34 is 1-fold. Accordingly, when a peak-to-peak current of the feedback signal DI which is the input current signal is set to 5 μApp, a peak-to-peak voltage of the input voltage signal DV of the drive signal output circuit 50 is VP1=5 μApp×40 KΩ2=0.2 Vpp. That is, a input voltage signal DV of a sine wave in which the peak-to-peak voltage is VP1=0.2Vpp is input to the drive signal output circuit 50 with an analog based voltage (AGND) as a center voltage.

Then, the gain (a gain by the OTA circuit 36, the I/V conversion circuit 39, and the highpass filter 34) in the drive signal output circuit 50 is K=5-fold. Accordingly, the drive signal output circuit 50 outputs the sine wave signal in which a peak-to-peak voltage is VP2=VP1×K=0.2 Vpp×5=1.00 Vpp as the drive signal DQ.

On the other hand, a peak-to-peak current of the drive current of the vibrator 10 is set to IDR=5 μA, and the equivalent series resistance of the vibrator 10 is R=200 KΩ. Accordingly, from a viewpoint of the drive current, the peak-to-peak voltage of the drive signal DQ is VP2=5 μA×200 KΩ=1.00 Vpp. This is coincident with VP2=VP1× K=0.2 Vpp×5=1.00 Vpp described above which is obtained from the gain K=5-fold.

Thus, in FIG. 6, when the peak-to-peak voltage of the input voltage signal DV is set to VP1, the peak-to-peak voltage of the drive signal DQ is set to VP2, and the peak-to-peak current of the drive current of the vibrator 10 which is set by the AGC loop of the gain control circuit 40 is set to IDP, a relationship of VP2=K×VP1=IDP×R is satisfied. This indicates that the relationships of K×RI=R and R+RN=0 described above are satisfied. For example, K=5-fold, RI=40 KΩ, and R=200 KΩ, and K×RI=5×40 KΩ=R is satisfied. Accordingly, it is possible to realize suitable sine wave driving described by D2 in FIG. 4B or FIG. 5C.

In addition, in FIG. 6, when a voltage difference between the high potential side power-supply voltage VDD and the low potential side power-supply voltage VSS (GND) is set to VDS, a relationship of VDS>VP2=K×VP1=IDP×R is satisfied. This indicates that the drive signal DQ is not a rectangular wave signal of which the amplitude exceeds the voltage difference VDS of VDD to VSS, but a sine wave signal of which the amplitude does not exceed the voltage difference VDS.

Figure 7:
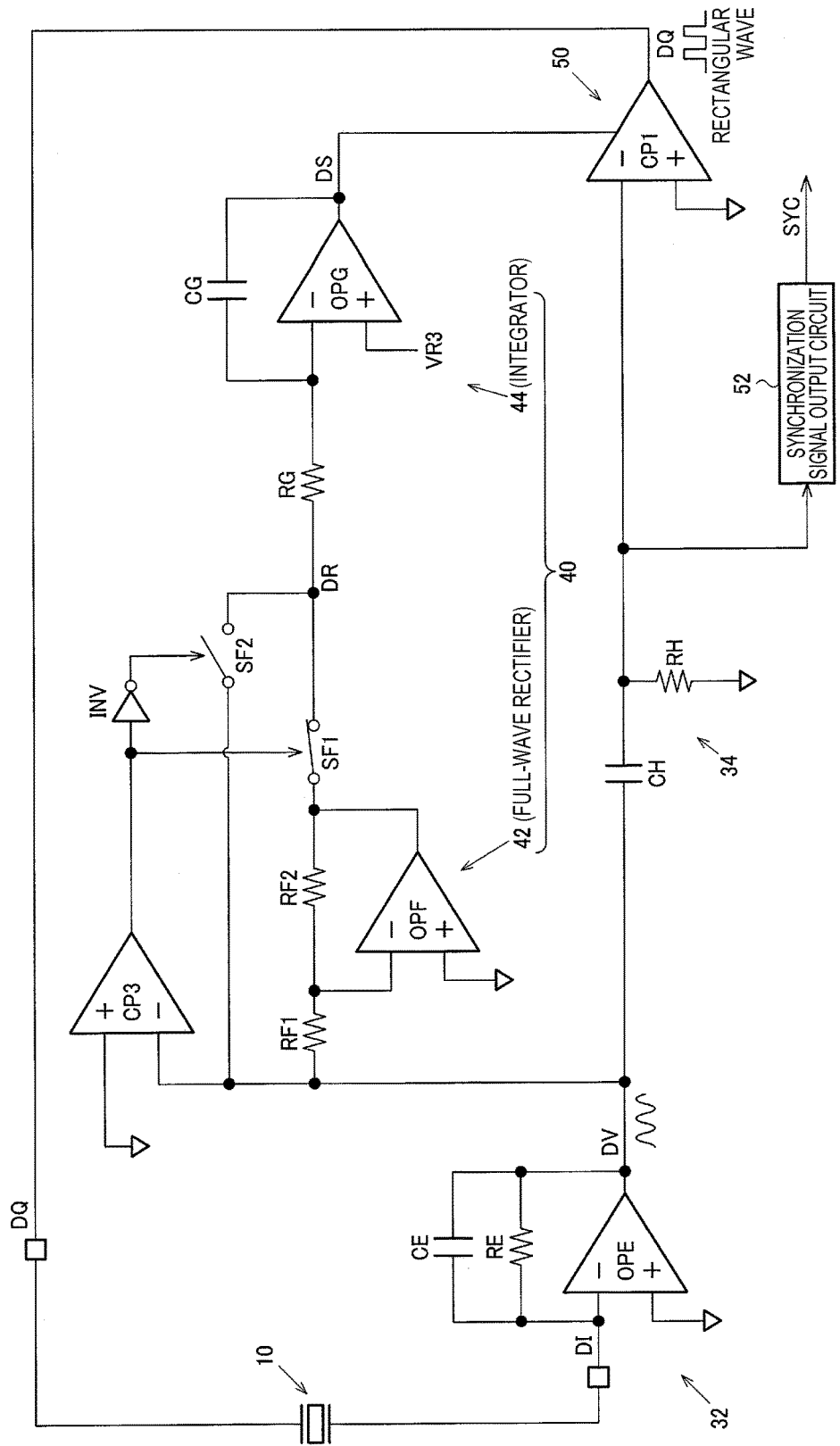
FIG. 7 is a configuration example of the driving circuit according to a comparative example.

FIG. 7 illustrates a configuration of the driving circuit of a comparative example according to this embodiment. In the driving circuit, the drive signal output circuit 50 is configured by a comparator CP1, and outputs the drive signal DQ of a rectangular wave.

Figure 8:
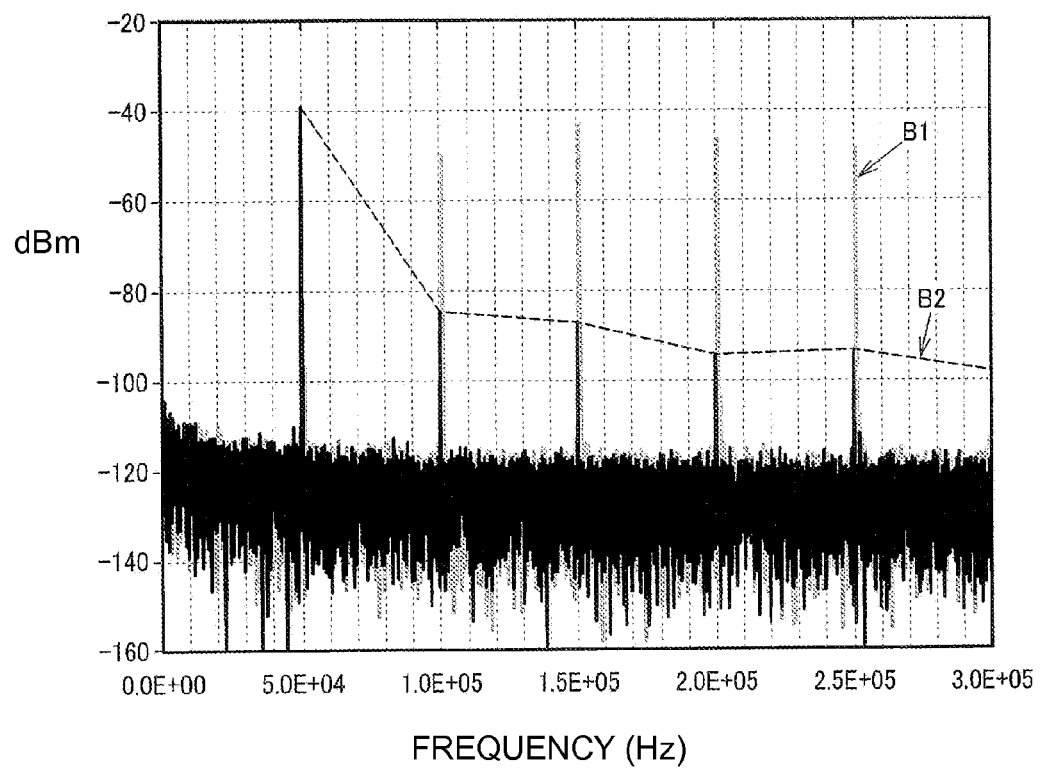
FIG. 8 is an explanatory view of a reduction of a harmonic component by the sine wave driving.

Then, in the configuration of FIG. 7, as illustrated by frequency properties of a spectrum diagram of the drive signal DQ illustrated in FIG. 8, a harmonic component as illustrated by B1 appears, and thus the detection performance of the detection device is degraded. In contrast, according to the driving circuit 30 of the this embodiment, frequency properties as illustrated by B2 in FIG. 8 are shown, and the harmonic component is reduced compared to the configuration of FIG. 7, and thus it is possible to improve the detection performance of the detection device.

Figure 9:
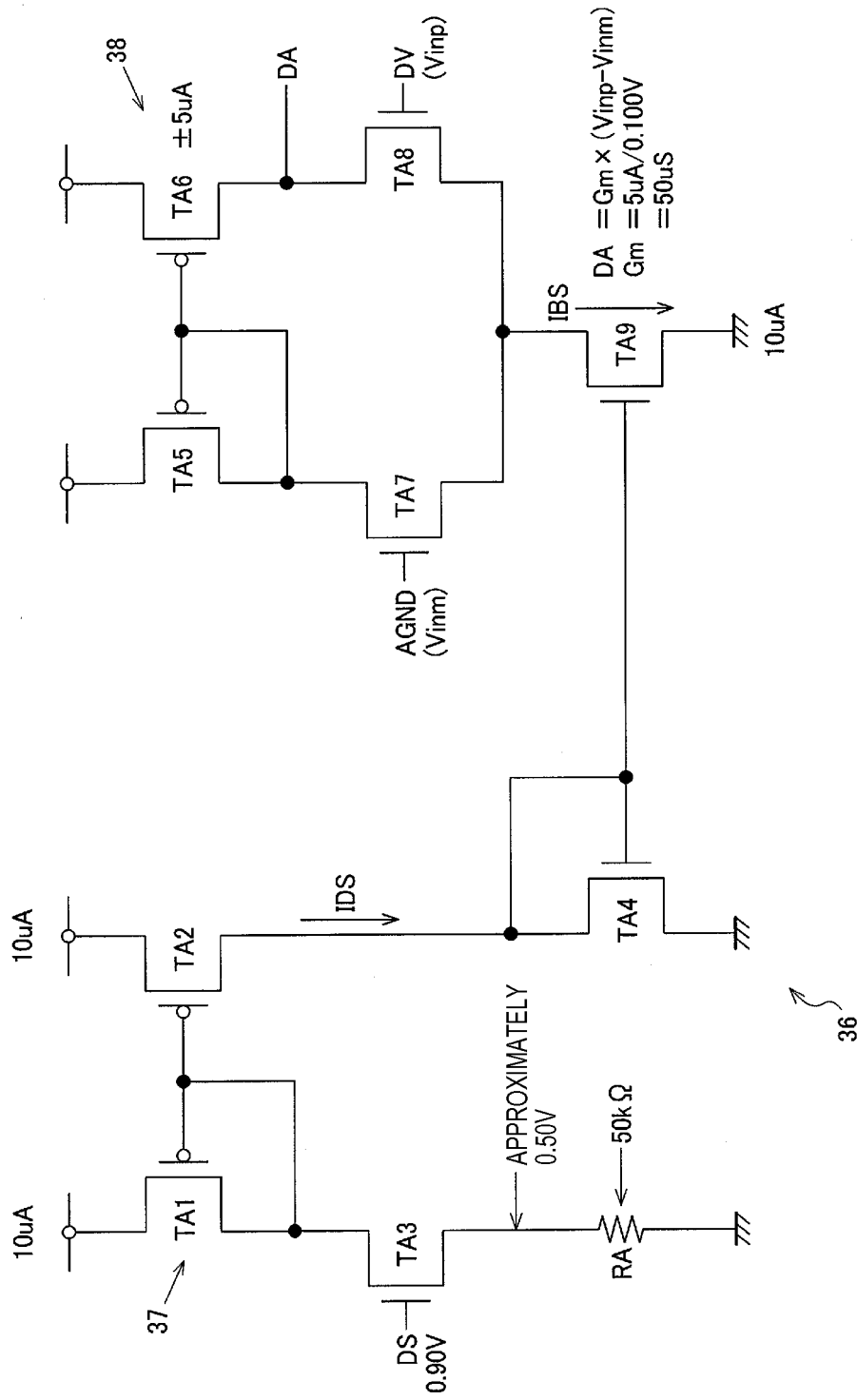
FIG. 9 is a detailed configuration example of an OTA circuit.

FIG. 9 illustrates a specific configuration example of the OTA circuit 36. The OTA circuit 36 includes a V/I conversion circuit 37 (a voltage-current conversion circuit), and a differential unit 38. Furthermore, a configuration of the OTA circuit 36 is not limited to a configuration illustrated in FIG. 9, but is able to be variously changed.

The V/I conversion circuit 37 converts the control voltage DS from the gain control circuit 40 to a control current IDS. The V/I conversion circuit 37 is configured by transistors TA1, TA2, TA3, and TA4, and a resistive element RA. Gates of the P type transistors TA1 and TA2 are commonly connected to each other. A drain of the N type transistor TA3 is connected to a drain of the transistor TA1, the control voltage DS is input into a gate thereof, and a source thereof is connected to one end of the resistive element RA. A drain and a gate of the N type transistor TA4 are connected to a drain of the transistor TA2.

In the differential unit 38, a bias current IBS set by the control current IDS flows to a bias current source (TA9), the analog based voltage (AGND) is input to a first differential input terminal (an inversion input terminal), and the input voltage signal DV is input to a second differential input terminal (a non-inversion input terminal). Then, the current signal DA is output to the I/V conversion circuit 39 (the second current-voltage conversion circuit).

The differential unit 38 is configured by transistors TA5, TA6, TA7, TA8, and TA9. Gates of the P type transistors TA5 and TA6 are commonly connected to each other. A drain of the N type transistor TA7 is connected to a drain of the transistor TA5, AGND is input into a gate thereof, and a source thereof is connected to a drain of the transistor TA9. A drain of the N type transistor TA8 is connected to a drain of the transistor TA6, the input voltage signal DV is input into a gate thereof, and a source thereof is connected to the drain of the transistor TA9. The N type transistor TA9 is a transistor which is a bias current source, and a gate thereof and a gate of the transistor TA4 of the V/I conversion circuit 37 are commonly connected to each other. The bias current IBS flowing to the transistor TA9 is a current in which the control current IDS created by the V/I conversion circuit 37 is set to a current mirror.

In FIG. 9, when the control voltage DS is 0.9 V, a source voltage of the transistor TA3 is approximately 0.5 V, and a current of 10 µA flows through resistive element RA. Accordingly, a current of IDS=10 µA flows as the control current. By the control current IDS, a current of IBS=10 µA flows through the differential unit 38 as a bias current. Then, by setting the bias current IBS in this way, the OTA circuit 36 is able to output a current signal DA of a sine wave of ±5 µA.

On the other hand, as illustrated in FIG. 6, AGND=0.9 V, and the input voltage signal DV is a signal in which the peak-to-peak voltage with AGND as the center voltage is VP1=0.2 Vpp, and is a voltage signal of a sine wave of ±0.1 V. Accordingly, the transconductance Gm is set to 5 µA/(Vinp−Vinm)=5 µA/0.1 V=50 µS.

In the configuration of FIG. 9, the control current IDS is set by the control voltage DS from the integrator 44, and the bias current IBS flowing through the differential unit 38 is set. Then, by the bias current IBS, a transconductance Gm of the OTA circuit 36 is set. That is, when the control voltage DS increases and decreases, the control current IDS and the bias current IBS increase and decrease, and thus transconductance Gm also increases and decreases. Then, the OTA circuit 36 converts the input voltage signal DV into the current signal DA using the transconductance Gm which is set by the control voltage DS. Then, the I/V conversion circuit 39 performs the I/V conversion with respect to the current signal DA, and outputs the drive signal DQ. Thus, the drive signal DQ of a sine wave in which the amplitude (the peak-to-peak voltage) is subjected to an AGC control by the control voltage DS is able to be output to the vibrator 10.

5. Modification Example

Figure 10:
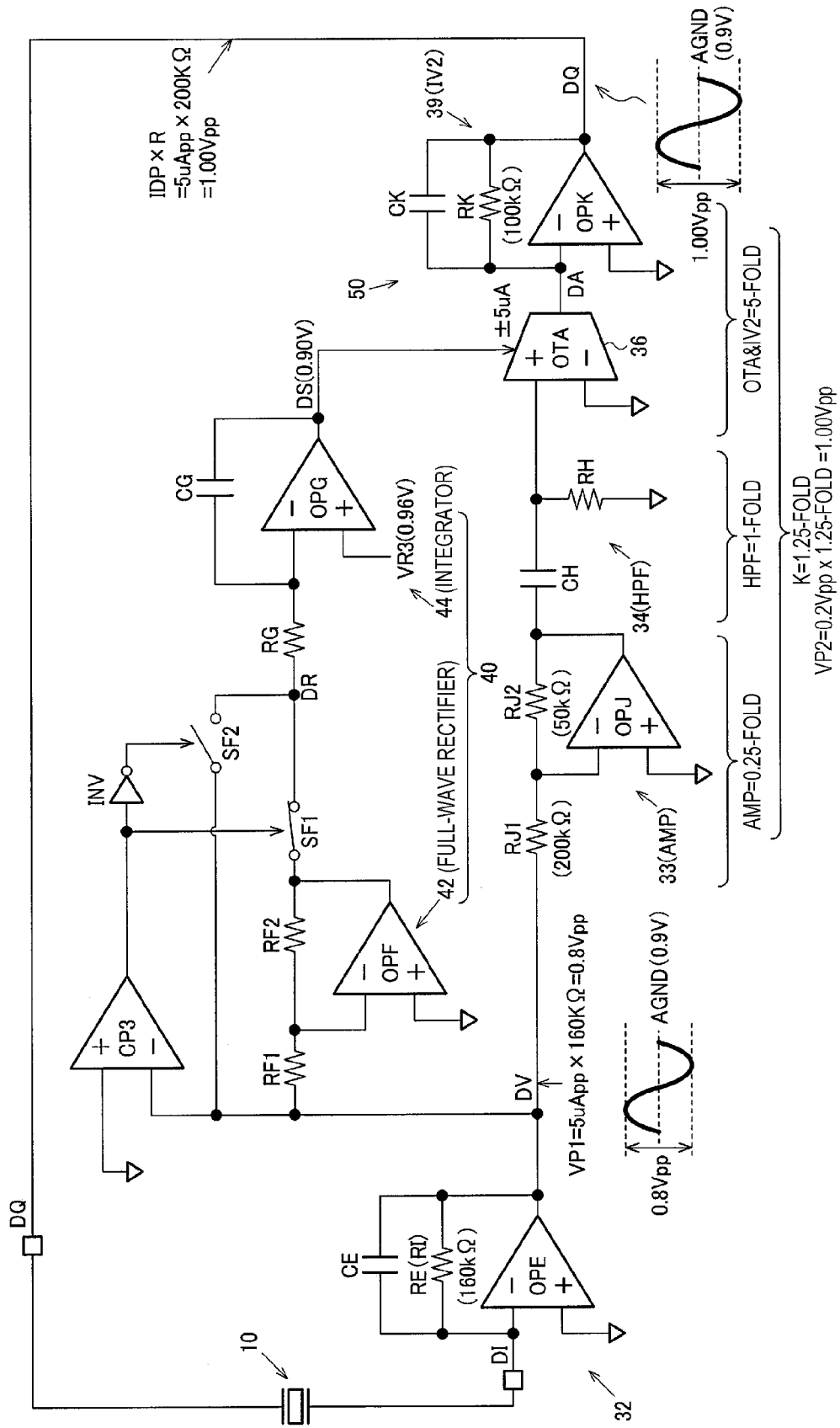
FIG. 10 is a first modification example of the driving circuit.

Next, various modification examples of the driving circuit 30 will be described. FIG. 10 is a first modification example of the driving circuit 30. A difference between the configuration of FIG. 6 and the first modification example of FIG. 10 is as follow.

First, in FIG. 6, a resistance RI of the resistive element RE is 40 KΩ, but in FIG. 10, the resistance RI is 160 KΩ. In addition, in FIG. 10, an inversion amplification circuit 33 is further disposed on an input stage side of the drive signal output circuit 50.

In FIG. 10, the resistance RI of the resistive element RE is 160 KΩ, and thus the peak-to-peak voltage of the signal DV is VP1=5 µApp×160 KΩ=0.8 Vpp, and is greater than the peak-to-peak voltage VP1=0.2Vpp of FIG. 6.

On the other hand, in FIG. 10, the inversion amplification circuit 33 (AMP) is disposed in the drive signal output circuit 50, and a gain of the inversion amplification circuit 33 is RJ2/RJ1=50 KΩ/200 KΩ=0.25. Accordingly, the gain of the drive signal output circuit 50 is K=0.25×5=1.25. Accordingly, even in a case of FIG. 10, a relational expression of K×RI=1.25×160 KΩ=200KΩ=R is satisfied, and thus it is possible to realize suitable sine wave driving described by D2 in FIG. 4B or FIG. 5C.

Figure 11:
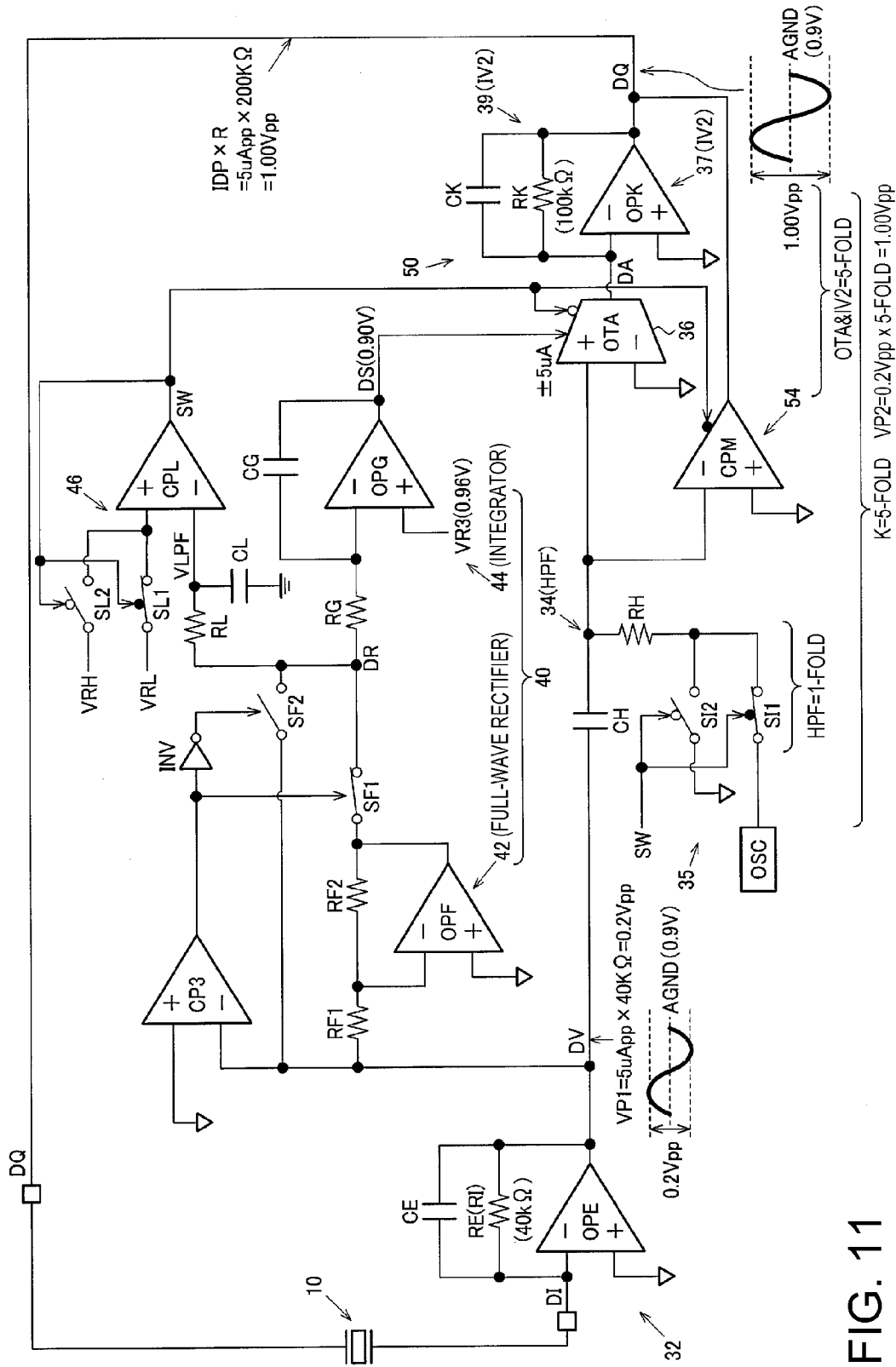
FIG. 11 is a second modification example of the driving circuit.
Figure 12:
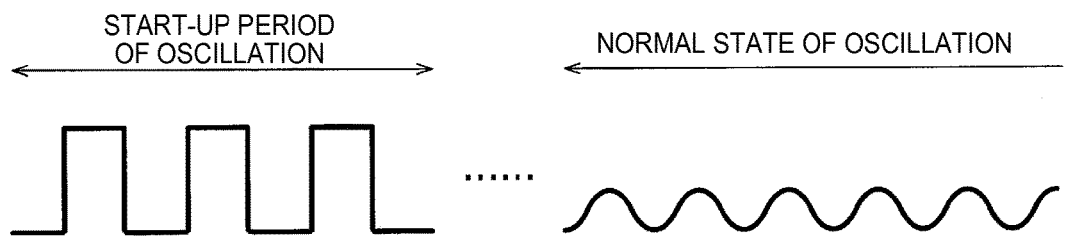
FIG. 12 is an explanatory view of a switching method of rectangular wave driving and the sine wave driving.

FIG. 11 is a second modification example of the driving circuit 30. In the second modification example of FIG. 11, an oscillation detector 46, a seed circuit 35, and a rectangular wave signal output circuit 54 are further disposed compared to the configuration example of FIG. 6.

The oscillation detector 46 (a start-up determination circuit) is a circuit which detects the oscillation, and detects whether or not the oscillation loop is in the oscillation state. Specifically, the oscillation detector 46 determines whether or not the oscillation loop is in the oscillation state on the basis of the signal DR after being subjected to the full-wave rectification of the full-wave rectifier 42, and outputs a detection signal SW of the oscillation. By the oscillation detector 46, it is possible to determine whether or not the oscillation start-up period is completed.

The oscillation detector 46 includes a comparator CPL, switch elements SL1 and SL2, a resistive element RL, and a capacitor CL. A lowpass filter is configured by the resistive element RL and the capacitor CL, and a voltage VLPF in which the signal DR after being subjected to the full-wave rectification is smoothed by the lowpass filter is input into an inversion input terminal of the comparator CPL. Then, in an initial state after the power-supply is activated, the detection signal SW is at an H level, and thus the switch element SL1 is turned ON, and the switch element SL2 is turned OFF. Accordingly, a reference voltage VRL of a low potential is input into a non-inversion input terminal of the comparator CPL, and the comparator CPL compares the reference voltage VRL with the voltage VLPF obtained by the signal DR after being subjected to the full-wave rectification.

In an oscillation start-up process, when the oscillation of the vibrator 10 is developed, the voltage VLPF increases according to this. Then, when the voltage VLPF exceeds the reference voltage VRL, the detection signal SW is at an L level from the H level, and thus the switch element SL1 is turned OFF, and the switch element SL2 is turned ON. Accordingly, a reference voltage VRH (>VRL) of a high potential is input into the non-inversion input terminal of the comparator CPL, and thus the detection signal SW is maintained at the L level.

The seed circuit 35 includes switch elements SI1 and SI2. For example, the highpass filter 34 is disposed in order to inhibit an adverse effect such as a DC offset voltage of the I/V conversion circuit 32 or the like, but when the highpass filter 34 is disposed, the seed circuit 35 for creating a seed of the oscillation is necessary. Then, in the initial state after the power-supply is activated, the detection signal SW of the oscillation detector 46 is at the H level, and thus the switch element SI1 is turned ON, and the switch element SI2 is turned OFF. Accordingly, an oscillation signal from an oscillator OSC which is separately disposed is input into a non-inversion input terminal of the OTA circuit 36 through the switch element SI1 and the resistive element RH, and thus the seed of the oscillation is formed, and the oscillation is able to be developed. Then, when the oscillation start-up period is completed, and the detection signal SW is at the L level, the switch element SI1 is turned OFF, and the switch element SI2 is turned ON. Accordingly, the oscillation signal from the oscillator OSC is not input into the non-inversion input terminal of the OTA circuit 36.

Then, in this embodiment, the drive signal output circuit 50 includes the rectangular wave signal output circuit 54 which receives the input voltage signal DV, and outputs the rectangular wave signal. In the rectangular wave signal output circuit 54, AGND is input into the non-inversion input terminal, and is realized by a comparator CPM in which the input voltage signal DV is input into the inversion input terminal.

Then, in the oscillation start-up period of the vibrator 10, the drive signal output circuit 50 outputs the signal of a rectangular wave from the rectangular wave signal output circuit 54 to the vibrator 10 as the drive signal DQ as illustrated in FIG. 11. Then, after the oscillation start-up period is completed, the drive signal DQ of a sine wave is output to the vibrator 10. That is, when the oscillation start-up period is completed, and is in the normal state of the oscillation, the drive signal output circuit 50 outputs the drive signal DQ of a sine wave.

Specifically, in the comparator CPM of the rectangular wave signal output circuit 54 and the OTA circuit 36, an operation enabled state and an operation disabled state are set by the detection signal SW from the oscillation detector 46. Then, in the oscillation start-up period, the switch signal SW is at the H level, the comparator CPM is set to the operation enabled state, and the OTA circuit 36 is set to the operation disabled state. Accordingly, the drive signal DQ of a rectangular wave which is created by the comparator CPM is output from the drive signal output circuit 50.

On the other hand, when the oscillation start-up period is completed, the switch signal SW is at the L level, and thus the comparator CPM is set to the operation disabled state, and the OTA circuit 36 is set to the operation enabled state. Accordingly, the drive signal DQ of a sine wave which is created by the OTA circuit 36 and the I/V conversion circuit 39 is output from the drive signal output circuit 50.

For example, in driving of the vibrator 10 by the drive signal DQ of a sine wave, as illustrated in FIG. 8, it is possible to improve the detection performance by reducing the harmonic component, but the development of the oscillation is extremely slow.

In this respect, in a configuration of FIG. 11, the drive signal of a rectangular wave which is created by the comparator CPM is output from the drive signal output circuit 50 in the oscillation start-up period, and thus it is possible to make the development of the oscillation rapid, and it is possible to complete the oscillation start-up period in an early stage.

Then, when it is determined that an oscillation period is completed by detection by the oscillation detector 46, the drive signal DQ of a sine wave which is created by the OTA circuit 36 and the I/V conversion circuit 39 is output from the drive signal output circuit 50. Accordingly, as illustrated in FIG. 8, it is possible to improve the detection performance by reducing the harmonic component, and thus it is possible to realize shortening of the oscillation start-up period and improvement of the detection performance together.

6. Detection Circuit

Figure 13:
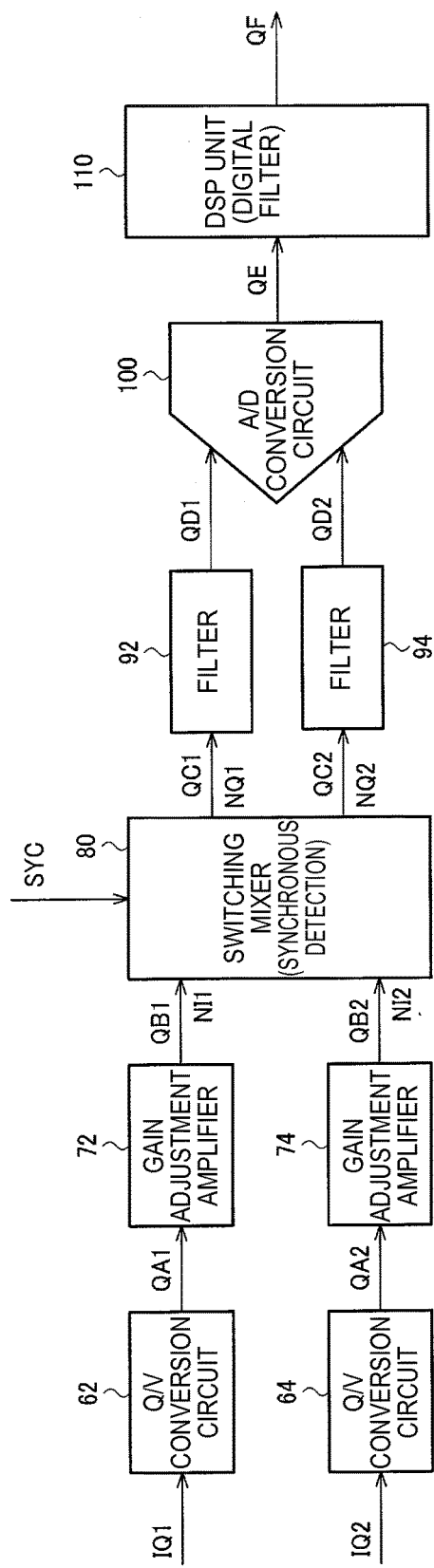
FIG. 13 is a configuration example of the detection circuit.

FIG. 13 illustrates a detailed configuration example of the detection circuit 60. FIG. 13 is an example of a full differential switching mixer type detection circuit 60.

As illustrated in FIG. 13, the full differential switching mixer type detection circuit 60 includes a first Q/V conversion circuit 62, a second Q/V conversion circuit 64, a first gain adjustment amplifier 72, a second gain adjustment amplifier 74, a switching mixer 80, a first filter 92, a second filter 94, an A/D conversion circuit 100, and a DSP unit 110 (a digital signal processing unit).

A first differential detection signal IQ1 and a second differential detection signal IQ2 from the vibrator 10 are input into the Q/V conversion circuits 62 and 64 (an electric charge-voltage conversion circuit). Then, the Q/V conversion circuits 62 and 64 convert an electric charge (a current) generated by the vibrator 10 into a voltage.

The gain adjustment amplifiers 72 and 74 amplify output signals QA1 and QA2 of the Q/V conversion circuits 62 and 64 by performing a gain adjustment with respect to the output signal. The gain adjustment amplifiers 72 and 74 are a so-called programmable gain amplifier, and amplify the signals QA1 and QA2 using a gain set by the control unit 140. For example, the gain adjustment amplifiers 72 and 74 amplify the signals QA1 and QA2 to a signal of an amplitude suitable for a voltage conversion range of the A/D conversion circuit 100.

The switching mixer 80 is a mixer which performs a differential synchronous detection on the basis of the synchronization signal SYC from the driving circuit 30. Specifically, in the switching mixer 80, an output signal QB1 of the gain adjustment amplifier 72 is input into a first input node NI1, and an output signal QB2 of the gain adjustment amplifier 74 is input into a second input node NI2. Then, the differential synchronous detection is performed by the synchronization signal SYC from the driving circuit 30, and the first differential output signal QC1 and the second differential output signal QC2 are output to the first output node NQ1 and the second output node NQ2. By the switching mixer 80, an unnecessary signal such as noise (1/f noise) occurring in the previous circuit (the Q/V conversion circuit, the gain adjustment amplifier) is frequency converted into a high frequency band. In addition, a desired signal which is a signal according to the Coriolis force is dropped into a direct current signal.

A first output signal QC1 from the first output node NQ1 of the switching mixer 80 is input into the filter 92. A second output signal QC2 from the second output node NQ2 of the switching mixer 80 is input into the filter 94. The filters 92 and 94, for example, are lowpass filters having frequency properties which allow the desired signal to pass through the filter by eliminating (attenuating) the unnecessary signal. For example, the unnecessary signal such as the 1/f noise which is frequency converted into a high frequency band by the switching mixer 80, is eliminated by the filters 92 and 94. In addition, the filters 92 and 94 are a passive filter which is configured by a passive element such as a resistive element or a capacitor without using the operational amplifier.

The A/D conversion circuit 100 receives the output signal QD1 from the filter 92 and the output signal QD2 from the filter 94, and performs a differential A/D conversion. Specifically, the A/D conversion circuit 100 performs the A/D conversion by sampling the output signals QD1 and QD2 using the filters 92 and 94 as a filter for anti aliasing (a prefilter). Then, in this embodiment, the output signal QD1 from the filter 92 and the output signal QD2 from the filter 94 are input into the A/D conversion circuit 100 without using the active element. As the A/D conversion circuit 100, for example, various types of A/D conversion circuits such as a Δ sigma type A/D conversion circuit or a sequential comparison type A/D conversion circuit are able to be adopted. When the Δ sigma type A/D conversion circuit is adopted, for example, the Δ sigma type A/D conversion circuit has a function of Correlated Double Sampling (CDS) or a chopper for reducing the 1/f noise, or the like, and for example, an A/D conversion circuit which is configured by a secondary Δ sigma modulator or the like is able to be used.

The Digital Signal Processing (DSP) unit 110 performs various digital signal processes. For example, the DSP unit 110, for example, performs a digital filter process of a band limitation according to an application of the desired signal, or a digital filter process of eliminating the noise occurring by the A/D conversion circuit 100 or the like. In addition, the DSP unit 110 performs a digital correction process such as a gain correction (a sensitivity adjustment), and an offset correction.

In the detection circuit 60 of FIG. 13, a full differential switching mixer type detection circuit is adopted. That is, the differential detection signals IQ1 and IQ2 from the vibrator 10 are subjected to a signal amplification or a gain adjustment by the Q/V conversion circuits 62 and 64, and the gain adjustment amplifiers 72 and 74, and input into the switching mixer 80 as the differential signals QB1 and QB2. Then, the switching mixer 80 performs a synchronous detection process by which the unnecessary signal is frequency converted into a high frequency band with respect to the differential signals QB1 and QB2. Then, the unnecessary signal which is frequency converted into a high frequency band is eliminated by the filters 92 and 94, and input into the A/D conversion circuit 100 as the differential signals QD1 and QD2, and thus the differential A/D conversion is performed.

According to the full differential switching mixer type detection circuit 60, the 1/f noise occurring by the Q/V conversion circuits 62 and 64, or the gain adjustment amplifiers 72 and 74, or the like is eliminated by a frequency conversion of the switching mixer 80, and by the lowpass filter properties of the filters 92 and 94. Then, the switching mixer 80 in which there is no gain, but less noise occurs (the 1/f noise does not occur), or the filters 92 and 94 which are configured by a passive element of low noise are disposed between the gain adjustment amplifiers 72 and 74 and the A/D conversion circuit 100. Accordingly, the noise occurring by the Q/V conversion circuits 62 and 64, or the gain adjustment amplifiers 72 and 74 is eliminated, and the noise occurring by the switching mixer 80 or the filters 92 and 94 is also suppressed to a minimum, and thus the signals QD1 and QD2 in a low noise state are input into the A/D conversion circuit 100, and are able to be subjected to the A/D conversion. In addition, the signals QD1 and QD2 are subjected to the A/D conversion as the differential signal, and thus it is possible to further improve an S/N ratio compared to a case where the A/D conversion is performed by a single end signal.

Furthermore, the detection circuit 60 of this embodiment is not limited to the full differential switching mixer type detection circuit illustrated in FIG. 13. For example, various types of detection circuits 60 such as a direct sampling type detection circuit illustrated in FIG. 14A, and an analog synchronous detection type detection circuit illustrated in FIG. 14B are able to be adopted.

Figure 14A:
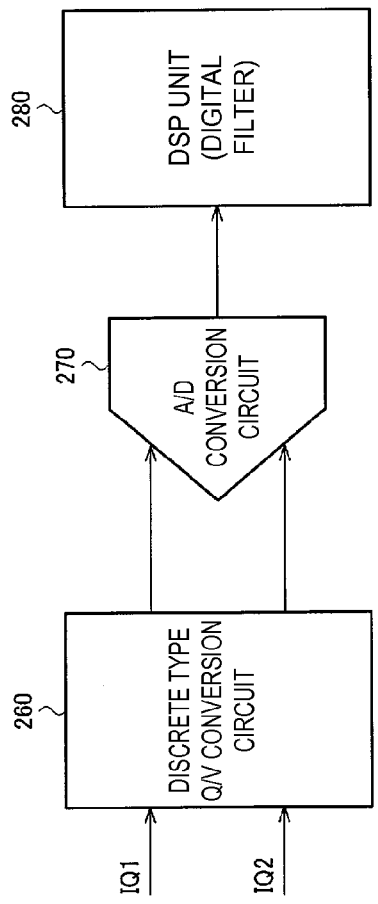
FIGS. 14A and 14B are other configuration examples of the detection circuit.

The direct sampling type detection circuit 60 of FIG. 14A includes a discrete type Q/V conversion circuit 260, an A/D conversion circuit 270, and a DSP unit 280. The direct sampling type detection circuit is a dominant configuration in terms of downsizing of the circuit. However, there is no filter for anti aliasing in a previous stage of the A/D conversion circuit 270, and thus it is difficult to avoid performance degradation due to folding noise. In response, in the full differential switching mixer type detection circuit of FIG. 13, the Q/V conversion circuits 62 and 64 are a continuous electric charge-voltage conversion circuit including a feedback resistive element, and thus it is possible to prevent the performance degradation due to the folding noise occurring in the direct sampling type detection circuit, and it is possible to realize a detection process of low noise in a small-scale circuit configuration.

Figure 14B:
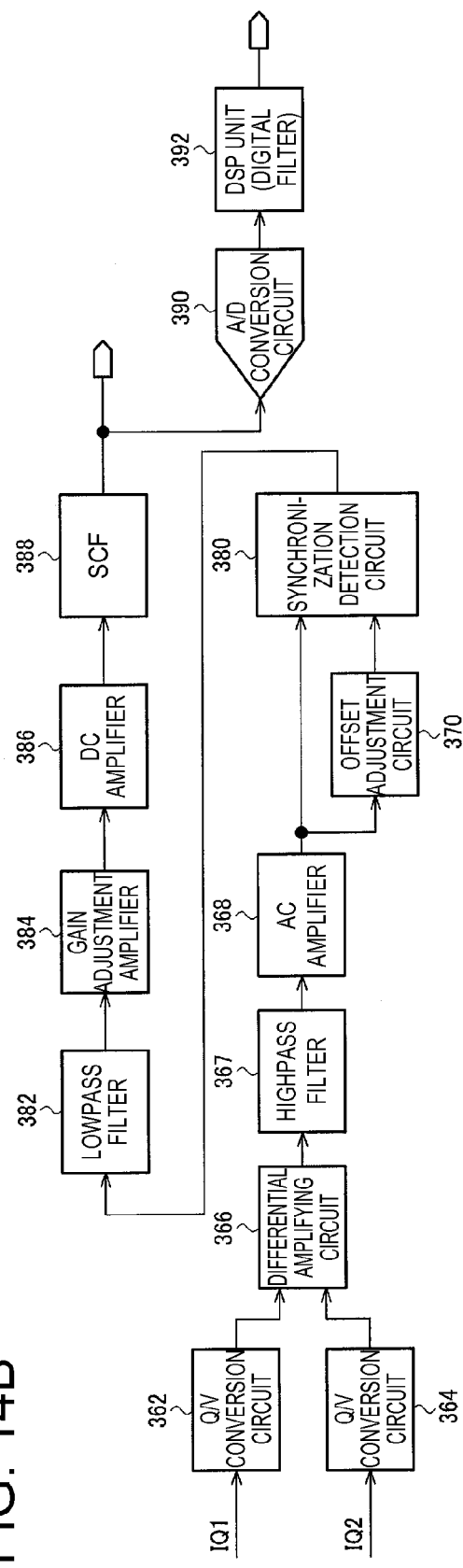

The analog synchronous detection type detection circuit 60 of FIG. 14B includes Q/V conversion circuits 362 and 364, a differential amplifying circuit 366, a highpass filter 367, an AC amplifier 368, an offset adjustment circuit 370, a synchronization detection circuit 380, a lowpass filter 382, a gain adjustment amplifier 384, a DC amplifier 386, and a switched capacitor filter (SCF) 388. In addition, for example, as an external circuit of the detection device, an A/D conversion circuit 390, and a DSP unit 392 (a digital filter) are disposed.

In the analog synchronous detection type detection circuit, for example, a gain of a signal in the detection circuit 60 increases, and thus it is possible to improve noise properties. However, the number of circuit blocks increases, and the circuit is upsized, or the number of analog circuit blocks which consume a lot of current increases, and thus power consumption may be excessive. In response, the full differential switching mixer type detection circuit of FIG. 13 decreases the number of circuit blocks compared to the analog synchronous detection type detection circuit, and thus it is possible to easily realize downsizing of the circuit or reducing of the power consumption. In addition, in the full differential switching mixer type detection circuit, the differential signals IQ1 and IQ2 from the vibrator 10 are subjected to a gain adjustment, a synchronous detection process, and a filter process in a state of the differential signal, and input into the A/D conversion circuit 100, and thus the A/D conversion is performed. For this reason, a configuration which is advantageous in noise reduction is realized compared to the analog synchronous detection type detection circuit in which the filter process, the synchronous detection process, the gain adjustment process, and the like are performed in a state of the single end signal.

Furthermore, the gyroscope sensor 510 (a sensor) of this embodiment, for example, is able to be assembled in various moving objects such as a car, an airplane, a motorcycle, a bicycle, and a vessel. The moving object, for example, includes a drive mechanism such as an engine or a motor, a steering mechanism such as a handle or a rudder, and various electronic apparatuses, and equipment and a device which are moved on the ground, in the sky, or in the sea.

Figure 15:
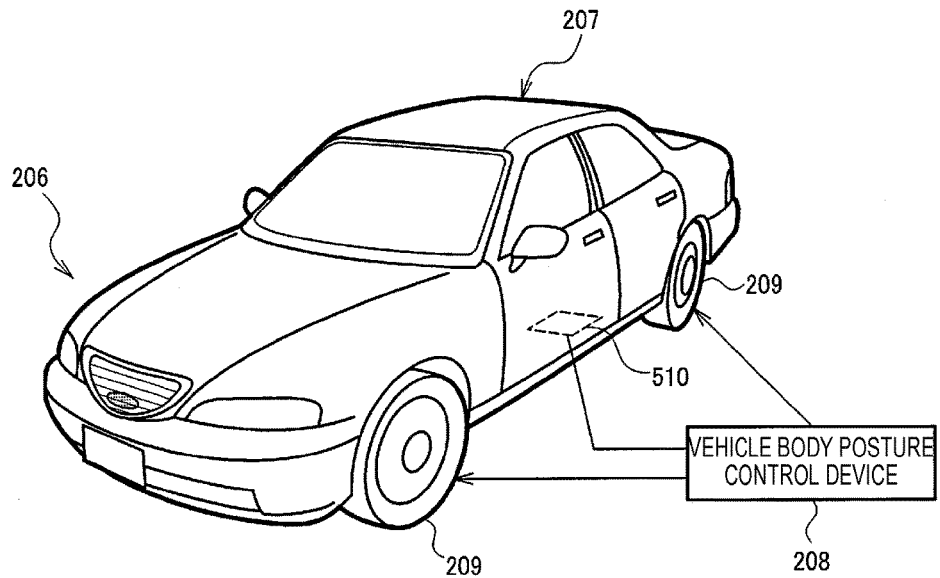
FIG. 15 is a conceptual diagram schematically illustrating a configuration of an automobile as a specific example of a moving object.

FIG. 15 schematically illustrates an automobile 206 as a specific example of the moving object. In the automobile 206, the gyroscope sensor 510 including the vibrator 10 and the detection device 20 is assembled. The gyroscope sensor 510 is able to detect a posture of a vehicle body 207. The detection signal of the gyroscope sensor 510 is able to be supplied to a vehicle body posture control device 208. The vehicle body posture control device 208, for example, is able to control hardness of a suspension according to a posture of the vehicle body 207 or to control a brake of each wheel 209. In addition, the posture control is able to be used in various moving objects such as a bipedal robot or an aircraft, a helicopter, and the like. The gyroscope sensor 510 is able to be assembled at the time of realizing the posture control.

Furthermore, as described above, this embodiment has been described in detail, but a person having ordinary skill in the art will easily understand that various modifications which are not substantially deviated from new matters and effects of the invention are possible. Accordingly, all the modification examples are within the scope of the invention. For example, in the description or in the drawings, the terms (the gyroscope sensor, the vibrator, the angular velocity information, and the like) described at least once along with different terms (the sensor, the physical quantity transducer, the physical quantity, and the like) having the broad meaning or the same meaning are able to be substituted by the different terms in any portion of the description or in the drawings. In addition, a configuration of the detection device, the sensor, the electronic apparatus, or the moving object, and a structure of the vibrator are not limited to the description in this embodiment, and are able to be variously changed.

The entire disclosure of Japanese Patent Application No. 2013-231342, filed Nov. 7, 2013 is expressly incorporated by reference herein.

What is claimed is:

1. A detection device comprising:
a driving circuit which receives a feedback signal from a vibrator, and drives the vibrator; and
a detection circuit which receives a detection signal from the vibrator, and detects a desired signal,
wherein the driving circuit includes
a current-voltage conversion circuit which receives the feedback signal, performs a current-voltage conversion, and outputs an input voltage signal after performing the current-voltage conversion,
a drive signal output circuit which amplifies the input voltage signal, and outputs a drive signal of a sine wave, and
a gain control circuit which controls a gain of amplification in the drive signal output circuit, and
when a resistance for a current-voltage conversion of the current-voltage conversion circuit is set to RI, the gain of the amplification of the drive signal in the drive signal output circuit is set to K, and an equivalent series resistance in a fundamental wave mode of the vibrator is set to R, the gain control circuit performs a gain control such that $K \cdot RI = R$ is satisfied,
wherein the drive signal output circuit includes:
an Operational Transconductance Amplifier (OTA) circuit in which a transconductance is set by a control voltage from the gain control circuit, and the input voltage signal is converted into a current signal; and
a second current-voltage conversion circuit which performs the current-voltage conversion with respect to the current signal from the OTA circuit, and outputs the drive signal.

2. The detection device according to claim 1,
wherein the OTA circuit includes
a voltage-current conversion circuit which converts the control voltage from the gain control circuit into a control current, and
a differential unit in which a bias current set by the control current flows to a bias current source, an analog based voltage is input into a first differential input terminal, the input voltage signal is input into a second differential input terminal, and the current signal is output to the second current-voltage conversion circuit.

3. The detection device according to claim 2,
wherein the gain control circuit includes
a full-wave rectifier which performs a full-wave rectification with respect to the input voltage signal, and
an integrator which performs an integral process with respect to a signal after being subjected to the full-wave rectification by the full-wave rectifier, and
the voltage-current conversion circuit converts the control voltage from the integrator into the control current.

4. The detection device according to claim 1,
wherein when a peak-to-peak voltage of the input voltage signal of the drive signal output circuit is set to VP1, a peak-to-peak voltage of the drive signal is set to VP2, a peak-to-peak current of a drive current of the vibrator which is set by an Automatic Gain control (AGC) loop of the gain control circuit is set to IDP, and a voltage difference between a high potential side power-supply voltage and a low potential side power-supply voltage is set to VDS, $VDS > VP2 = K \cdot VP1 = IDP \cdot R$ is satisfied.

5. The detection device according to claim 1,
wherein the drive signal output circuit includes a rectangular wave signal output circuit which receives the input voltage signal, and outputs a rectangular wave signal, and the drive signal output circuit outputs the rectangular wave signal from the rectangular wave signal output circuit to the vibrator as the drive signal in an oscillation start-up period of the vibrator, and outputs the drive signal of a sine wave after the oscillation start-up period is completed.

6. A sensor comprising:
the detection device according to claim 1; and
a vibrator.

7. A sensor comprising:
the detection device according to claim 2; and
a vibrator.

8. A sensor comprising:
the detection device according to claim 3; and
a vibrator.

9. A sensor comprising:
the detection device according to claim 4; and
a vibrator.

10. An electronic apparatus comprising the detection device according to claim 1.

11. An electronic apparatus comprising the detection device according to claim 2.

12. An electronic apparatus comprising the detection device according to claim 3.

13. An electronic apparatus comprising the detection device according to claim 4.

14. A moving object comprising the detection device according to claim 1.

15. A moving object comprising the detection device according to claim 2.

16. A moving object comprising the detection device according to claim 3.

* * * * *